(12) United States Patent
Terashima

(10) Patent No.: US 8,093,660 B2
(45) Date of Patent: Jan. 10, 2012

(54) SEMICONDUCTOR DEVICE

(75) Inventor: Tomohide Terashima, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 476 days.

(21) Appl. No.: 12/205,973

(22) Filed: Sep. 8, 2008

(65) Prior Publication Data

US 2009/0294799 A1 Dec. 3, 2009

(30) Foreign Application Priority Data

May 30, 2008 (JP) ................. 2008-142511

(51) Int. Cl.
*H01L 27/06* (2006.01)
(52) U.S. Cl. ............... 257/370; 257/378; 257/E29.197
(58) Field of Classification Search .............. 257/378, 257/370, 577, E29.197
See application file for complete search history.

(56) References Cited

U.S. PATENT DOCUMENTS

| 5,378,903 | A | | 1/1995 | Otsuki et al. |
| 5,744,830 | A | * | 4/1998 | Ekkanath-Madathil et al. ............... 257/E29.197 |
| 6,469,352 | B2 | * | 10/2002 | Ohshima et al. ............. 257/355 |
| 6,586,780 | B1 | * | 7/2003 | Terashima ................. 257/140 |
| 7,071,516 | B2 | * | 7/2006 | Terashima ................. 257/378 |
| 7,723,802 | B2 | * | 5/2010 | Terashima ............. 257/E29.197 |
| 2003/0111694 | A1 | | 6/2003 | Terashima |
| 2006/0118860 | A1 | * | 6/2006 | Hatade ....................... 257/328 |

FOREIGN PATENT DOCUMENTS

| CN | 1604338 A | 4/2005 |
| DE | 44 33 796 A1 | 3/1996 |
| DE | 195 34 388 A1 | 3/1996 |
| JP | 61-166223 | 7/1986 |
| JP | 4369116 | 12/1992 |
| JP | 7-226511 | 8/1995 |
| JP | 11-354657 | 12/1999 |
| JP | 2000-114406 | 4/2000 |
| JP | 2003-158269 | 5/2003 |
| JP | 2005-109394 | 4/2005 |
| JP | 2006-66692 | 3/2006 |
| JP | 2008-85307 | 4/2008 |

OTHER PUBLICATIONS

U.S. Appl. No. 12/480,298, filed Jun. 8, 2009, Terashima.
Chinese Office Action issued Aug. 8, 2011, in Patent Application No. 200810187433.7 (with English-language translation).

* cited by examiner

*Primary Examiner* — Matthew Landau
*Assistant Examiner* — Sun M Kim
(74) *Attorney, Agent, or Firm* — Oblon, Spivak, McClelland, Maier & Neustadt, L.L.P.

(57) ABSTRACT

A voltage mitigating element mitigating a voltage applied across a gate insulating film in an off state of an insulated gate bipolar transistor (IGBT) is arranged to a gate electrode node of a P-channel MOS transistor provided for suppressing flow-in of holes at the time of turn-off of the IGBT. Withstanding voltage characteristics are improved and an occupation area thereof is reduced while maintaining switching characteristics and a low on-resistance of an insulated gate bipolar transistor.

17 Claims, 9 Drawing Sheets

: $Vc-Ve > Vg2-Ve \geq 0$

SEMICONDUCTOR DEVICE

BACKGROUND OF THE INVENTION

1. Field of the Invention

The present invention relates to a semiconductor device, and particularly to a structure of a semiconductor device incorporating an IGBT (Insulated Gate Bipolar Transistor). More particularly, the present invention relates to a structure for reducing an occupation area of a semiconductor device containing a P-channel MOS transistor (insulated gate field effect transistor) provided for improving turn-off characteristics of the IGBT while maintaining breakdown voltage characteristics of the semiconductor device.

2. Description of the Background Art

The IGBT (Insulated Gate Bipolar Transistor) has been known as a power device handling a large electric power. The IGBT contains an MOS transistor (insulated gate field effect transistor) to control the base current of the bipolar transistor, in view of an equivalent circuit. The IGBT has both of an advantage of fast switching characteristics of the MOS transistor and an advantage of high-voltage/large-current processing capacity of the bipolar transistor.

In the IGBT, a low on-voltage and a low switching loss are required for reducing a power loss. Generally, in turn-on of the IGBT, holes of minority carriers are injected from a P-type collector layer into an N-type base layer (drift layer), and a conductivity modulation of an N-drift layer is caused to lower a resistance of the drift layer. When the N-type base layer (drift layer) has the resistance lowered through the conductivity modulation, more electrons are injected from an emitter layer and the IGBT rapidly transits into the on state (conductive state).

In the on state, a collector-to-emitter voltage (on-voltage) is substantially applied across this N-type base layer. In order to reduce this on-voltage, a majority carrier current in the drift layer is increased to decrease the resistance value of the drift layer. In turn-off, however, excessive carriers in the drift layer must be entirely discharged externally from the IGBT or must be annihilated through recombination of electrons and holes. Therefore, when a large amount of excessive carriers are present, a current continues to flow until the carriers are discharged, resulting in increased turn-off loss.

Patent documents 1 and 2 (Japanese Patent Laying-Open Nos. 2003-158269 and 2005-109394) disclose structures for reducing the turn-off loss of the IGBT to rapidly turn off it.

In Patent document 1 (Japanese Patent Laying-Open No. 2003-158269), an insulated gate type control electrode is provided at a surface of a drift layer of an IGBT. In turn-off of the IGBT, a potential of this insulated gate type control electrode is adjusted to absorb holes produced in the drift layer, for suppressing occurrence of a tail current in the turn-off.

In the insulated gate type control electrode disclosed in Patent document 1, the gate insulating film has a thickness, e.g., of 5 nm to 30 nm and the holes are forcedly extracted out through a tunneling phenomenon or an avalanche phenomenon.

In the structure disclosed in Patent document 2 (Japanese Patent Laying-Open No. 2005-109394), a P-channel MOS transistor (insulated gate field effect transistor) is arranged between a collector electrode node and a base of a bipolar transistor. An N-channel MOS transistor for controlling a base current of the bipolar transistor is arranged in series with the P-channel MOS transistor.

The P-channel MOS transistor is kept non-conductive during the operation (on state) of the IGBT, and is set conductive in turn-off to bypass a hole current flowing into the bipolar transistor from the collector electrode. The holes are prevented from being injected into the base layer from the collector electrode in the turn-off, and residual carriers (holes) are rapidly discharged from the drift layer (base layer) of the bipolar transistor, to reduce the switching loss. Thus, the low switching loss and the fast operation in the turn-off may be achieved, while maintaining the low on-voltage of the IGBT.

In the structure disclosed in Patent document 2, the gate insulating film of the P-channel MOS transistor has a thickness that ensures a gate withstanding voltage equal to or larger than, e.g., an element withstanding voltage of the field insulating film or the like, in order to ensure the withstanding voltage during the off state.

In Patent document 1 as described above, the insulated gate control electrode arranged at the surface of the drift layer (base layer) is used for discharging the holes in the turn-off, utilizing the tunneling phenomenon or the avalanche phenomenon. In this case, a high voltage is applied across the insulating film of 5 nm to 30 nm in thickness located under the control electrode, and such a problem may be caused that the breakdown characteristics of this insulating film are liable to deteriorate.

In the structure disclosed in Patent document 1, the insulated gate type control electrode is arranged independently of the control electrode (the gate of the MOS transistor) controlling the turn-on and turn-off of the IGBT. Thus, such a problem may be caused that adjustment between the timing of the turn-on/turn-off of the IGBT and the timing of the voltage application to the insulated gate control electrode may become difficult.

In the structure disclosed in Patent document 2 as described above, the gate electrode of the P-channel MOS transistor is fixed to the ground level, or the gate voltages of both the P- and N-channel MOS transistors are controlled according to the output signal of a common same control circuit.

While the IGBT is off (non-conductive), the P-channel MOS transistor is kept on (conductive). In this state, the gate electrode of the P-channel MOS transistor is supplied with a voltage similar in level to a voltage on the emitter electrode. Therefore, when the P-channel MOS transistor turns on, the gate thereof receives a high voltage similar in level to a collector to emitter voltage Vce. Therefore, for the gate insulating film, the P-channel MOS transistor has a thick insulating film of a thickness larger than or equal to, e.g., a thickness of the field insulating film, for ensuring the withstanding voltage. Consequently, this P-channel MOS transistor has a larger height than N-channel MOS transistors at a periphery thereof, resulting in a problem that a large step or difference in level occurs in the IGBT. Since the P-channel MOS transistor receives the high voltage, a sufficient distance must be kept from the surrounding impurity regions for ensuring the insulation with respect to the impurity regions, which results in undesired increase of the occupation area of the device.

SUMMARY OF THE INVENTION

An object of the present invention is to provide a semiconductor device that can maintain a low on-resistance, a low switching loss and breakdown characteristics, and further can reduce an occupation area of the element of the device.

Briefly stated, a semiconductor device according to a first aspect of the invention includes a bipolar transistor; a first insulated gate field effect transistor controlling a base current of the bipolar transistor according to a control signal; a second insulated gate field effect transistor to short-circuit a base and an emitter of the bipolar transistor upon turn off of the bipolar transistor; and a voltage mitigating element for mitigating a voltage applied across a gate insulating film of the second insulated gate field effect transistor upon turn off of the device.

The voltage mitigating element is preferably a diode element of a PN junction type or a junction-type field effect transistor.

Another aspect of the invention provides a structure of a semiconductor device formed according to a first aspect. Briefly stated, the semiconductor device according to the second aspect has a semiconductor region for forming a bipolar transistor, a first insulated gate field effect transistor for controlling on and off of the bipolar transistor, and a second insulated gate field effect transistor for short-circuiting an emitter and a base of this bipolar transistor upon turn off of the bipolar transistor, and a voltage mitigating element formed at a different region on a common semiconductor substrate region. The voltage mitigating element mitigates a voltage applied to a gate insulating film of the second insulated gate field effect transistor upon turn off of the bipolar transistor. This voltage mitigating element includes the semiconductor substrate region as a part of components thereof, and is configured to utilize a punch-through in the semiconductor substrate region.

In an embodiment, a semiconductor device according to another aspect of the invention includes a semiconductor substrate region of a first conductivity type; a first semiconductor region of a second conductivity type formed at a surface of the semiconductor substrate region; a second semiconductor region of the second conductivity type formed at the surface of the semiconductor substrate region and spaced from the first semiconductor region; a third semiconductor region of the first conductivity type adjacent to the first semiconductor region; a fourth semiconductor region of the first conductivity type formed on the second semiconductor region and on a surface of a part of the first semiconductor region; a first impurity region of the second conductivity type formed at a partial region of a surface of the fourth semiconductor region; a first electrode layer electrically connected to the fourth semiconductor region and the first impurity region; a second electrode layer formed on the fourth semiconductor region between the first impurity region and the first semiconductor region and on a part of the first semiconductor region with a first insulating film formed in between; second and third impurity regions of the first conductivity type formed at a surface of the first semiconductor region, spaced from the fourth semiconductor region and spaced from each other; a fourth impurity region of the second conductivity type formed at the surface of the first semiconductor region and adjacent to the third impurity region; a third electrode layer electrically connected to the second impurity region; a fourth electrode layer formed on the surface of the first semiconductor region located between the second and third impurity regions with a second insulating film formed in between; a fifth electrode layer electrically connected to the third and fourth impurity regions; and a fifth impurity region of the second conductivity type formed at the surface of the second semiconductor region and electrically coupled to the fourth electrode layer.

In another embodiment, a semiconductor device according to another aspect of the invention includes a semiconductor substrate region of a first conductivity type; first and second semiconductor regions of a second conductivity type formed at a surface of the semiconductor substrate region and spaced from each other; a third semiconductor region of the first conductivity type formed in contact with the first semiconductor region; a fourth semiconductor region of the first conductivity type formed on the third semiconductor region and on a surface of a part of the first semiconductor region; a first impurity region of the second conductivity type formed at a surface of a part of the fourth semiconductor region; a first electrode layer electrically connected to the fourth semiconductor region and the first impurity region; a second electrode layer formed on the fourth semiconductor region located between the first impurity region and the first semiconductor region and on the first semiconductor region with a first insulating film formed in between; second and third impurity regions of the first conductivity type formed at the surface of the first semiconductor region, spaced from the fourth semiconductor region and spaced from each other; a third electrode layer electrically connected to the second impurity region; a fourth electrode layer formed on the surface of the first semiconductor region located between the second and third impurity regions with a second insulating film formed in between; a fourth impurity region of the second conductivity type formed at the surface of the first semiconductor region and adjacent to the third impurity region; a fifth electrode layer electrically connected to the third and fourth impurity regions; and a fifth impurity region of the first conductivity type spaced from the third and fourth impurity regions, located on a surface of a part of each of the first and second semiconductor regions, formed continuously over the semiconductor substrate region located between the first and second semiconductor regions, and electrically connected to the fourth electrode layer.

In still another embodiment, a semiconductor device according to another aspect of the invention includes a semiconductor substrate region of a first conductivity type; first and second semiconductor regions of a second conductivity type formed at a surface of the semiconductor substrate region and spaced from each other; a third semiconductor region of the first conductivity type formed in contact with the first semiconductor region; a fourth semiconductor region of the first conductivity type formed on the third semiconductor region and on a surface of a part of the first semiconductor region; a first impurity region of the second conductivity type formed at a surface of a part of the fourth semiconductor region; a first electrode layer electrically connected to the fourth semiconductor region and the first impurity region; a second electrode layer formed on the fourth semiconductor region located between the first impurity region and the first semiconductor region and on the first semiconductor region with a first insulating film formed in between; second and third impurity regions of the first conductivity type formed at the surface of the first semiconductor region, spaced from the fourth semiconductor region and spaced from each other; a third electrode layer electrically connected to the second impurity region; a fourth electrode layer formed on the surface of the first semiconductor region located between the second and third impurity regions with a second insulating film formed in between; a fourth impurity region of the second conductivity type formed at the surface of the first semiconductor region and adjacent to the third impurity region; a fifth electrode layer electrically connected to the third and fourth impurity regions; a fifth semiconductor region of the first conductivity type located between the first and second semiconductor regions and being coupled to the semiconductor substrate region; a fifth impurity region of the first conductivity type formed at the surface of the fifth semiconductor region and electrically coupled to the fourth electrode layer; and first and second buried semiconductor regions of the second conductivity type formed between the semiconductor substrate region and the first semiconductor region and between the semiconductor substrate region and the second semiconductor region, respectively, and spaced from each other. The fifth semiconductor region is coupled to the semiconductor substrate region via a region between the first and second buried semiconductor regions.

By mitigating the gate voltage of the second insulated gate field effect transistor, it is possible to reduce the gate insulating film thickness of the second insulated gate field effect transistor, and it is also possible to reduce a length of the region for ensuring the withstanding voltage with respect to a peripheral region. Therefore, the semiconductor device of a small occupation area can be implemented while ensuring a low switching loss and a low on-voltage.

This voltage mitigating element is formed in a region other than the region where the insulated gate field effect transistor is formed, such that a part of the semiconductor substrate region may be used as a part of the region of the mitigating element. Thus, it is possible to mitigate reliably the voltage applied across the gate insulating film of the insulated gate field effect transistor by the simple circuit structure without adversely affecting the arrangement of the components of the IGBT.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
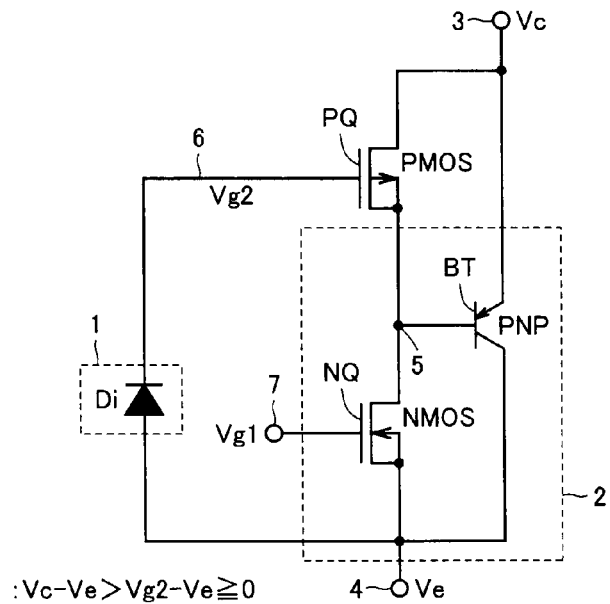
FIG. 1 shows an electrically equivalent circuit of a semiconductor device according to a first embodiment of the invention.

FIG. 1 shows an electrically equivalent circuit of a semiconductor device according to a first embodiment of the invention. Referring to FIG. 1, the semiconductor device includes a PNP bipolar transistor (first bipolar transistor) BT, an N-channel MOS transistor (first insulated gate field effect transistor) NQ for controlling a base current of the PNP bipolar transistor BT, and a P-channel MOS transistor (second insulated gate field effect transistor) PQ for blocking carrier injection upon turn off of bipolar transistor BT.

Bipolar transistor BT has an emitter region (first conduction node) connected to a collector electrode node (first electrode node) 3 and a collector region (second conduction node) connected to an emitter electrode node (second electrode node) 4. MOS transistor NQ has a source coupled to emitter electrode node 4, a gate electrode node 7 receiving a control signal Vg1 and a drain connected to a base region 5 of bipolar transistor BT. MOS transistor NQ has a back gate (substrate) and a source coupled to each other.

MOS transistor PQ has a source region (third conduction node) connected to collector electrode node 3, and has a substrate (back gate) and a drain (fourth conduction node) both connected to base electrode node (base node) 5 of bipolar transistor BT. A circuit section 2 formed of bipolar transistor BT and MOS transistor NQ corresponds to an electrically equivalent circuit of a general IGBT. In the following description, the "IGBT" refers to the section represented by the block 2.

The semiconductor device shown in FIG. 1 further includes a voltage mitigating element 1 connected between a gate electrode node 6 of MOS transistor PQ and emitter electrode node 4. Voltage mitigating element 1 mitigates the voltage applied across the gate insulating film of MOS transistor PQ in turn off of MOS transistor PQ.

Voltage mitigating element 1 in the first embodiment is formed of a PN junction diode (diode element) Di. PN junction diode Di has a cathode connected to gate electrode node 6 of MOS transistor PQ and an anode connected to emitter electrode node 4.

Figure 2:
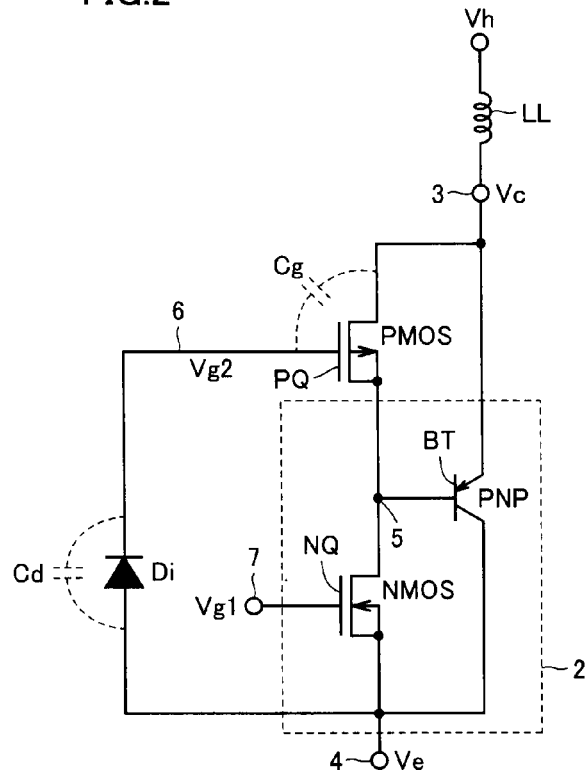
FIG. 2 schematically shows parasitic components of the semiconductor device according to the first embodiment of the invention.

It is now considered the state where an inductive load LL is connected to collector electrode node 3 of the semiconductor device as shown in FIG. 2. Inductive load LL is connected between a power supply node supplying a high-side voltage Vh and collector electrode node 3. A gate capacitance Cg is present between gate electrode node 6 of MOS transistor PQ and collector electrode node 3. A parasitic capacitance Cd by a PN junction is present in diode element Di.

In the arrangement shown in FIG. 2, when an IGBT 2 is turned on, due to a component (L·(di/dt)) of inductive load LL, most of high-side voltage Vh is applied across inductive load LL, and a collector potential Vc of collector electrode node 3 rapidly lowers. When IGBT 2 is turned off, collector potential Vc of collector electrode node 3 attains substantially the same level as high-side voltage Vh. It is now assumed that MOS transistor PQ has an absolute value, Vthp, of a threshold voltage (which will be simply referred to as a "threshold voltage Vthp" hereinafter). Also, an emitter potential Ve of emitter electrode node 4 is set to a lowest voltage level among the voltages usually applied to the semiconductor device.

In the following description, the "conductive state" and the "non-conductive state" represent the same means as the "on state" and the "off state", respectively. However, the terms of "conductive state" and the "nonconductive state" are used for particularly enhancing the presence and absence of the current, respectively.

When IGBT 2 is to turn on, control voltage Vg1 is set to an H level (logical high level) and applied to gate electrode node 7 of MOS transistor NQ to turn on MOS transistor NQ. Accordingly, bipolar transistor BT is supplied with a base current and attains the conductive state so that IGBT 2 is turned on. When IGBT 2 is turned on, a potential Vg2 of gate electrode node 6 of MOS transistor PQ lowers with lowering of collector potential Vc of collector electrode node 3, depending on capacitance values of capacitances Cg and Cd. When gate potential Vg2 of gate electrode node 6 attains a level of emitter potential Ve of emitter electrode node 4, a forward bias operation of diode element Di suppresses potential lowering of gate potential Vg2 of gate electrode node 6, and diode Di clamps the lowest potential of gate potential Vg2.

In the turn-on of IGBT 2, when a difference (Vc−Vg2) between collector potential Vc of collector electrode node 3 and gate potential Vg2 of gate electrode node 6 becomes equal to or lower than threshold voltage Vthp of MOS transistor PQ or the condition of (Vc−Vg2<Vthp) is satisfied, MOS transistor PQ turns off. In the turn-on operation, therefore, an operation of restricting the hole injection into PNP bipolar transistor BT is not performed.

In the turn-off operation of IGBT 2, control voltage Vg1 applied to gate electrode node 7 of MOS transistor NQ is set to, e.g., 0 V, and MOS transistor NQ is turned off. Accordingly, the supply of the base current to bipolar transistor BT stops, and NPN bipolar transistor BT transits to the off state. Collector potential Vc of collector electrode node 3 rises according to the transition of bipolar transistor BT to the off state. Through parasitic capacitances Cg and Cd, gate potential Vg2 rises in response to the rising of collector potential Vc.

In the turn-off operation of IGBT 2, when a difference (Vc−Vg2) between collector potential Vc and gate potential Vg2 exceeds the threshold voltage of MOS transistor PQ, MOS transistor PQ is turned on to short-circuit the emitter region and base region (base electrode node 5) of PNP bipolar transistor BT. Accordingly, MOS transistor PQ discharges the current flowing from collector electrode node 3, and the supply of holes to PNP bipolar transistor BT is blocked.

In the turn-off, since the supply of holes to the emitter region of PNP bipolar transistor BT is blocked, collector potential Vc of collector electrode node 3 rapidly rises when the discharging of carriers from the base region of bipolar transistor BT is completed. Thus, the period for which a tail current flows can be short, and a switching loss at the time of turn-off can be reduced, so that the fast operation can be achieved. In the on state (conductive state) of IGBT 2, a collector to emitter voltage Vce of bipolar transistor BT is sufficiently low, and the low on-voltage can be achieved.

During a transition state, e.g., in turn-off process, gate potential Vg2 attains the voltage level that is determined by parasitic capacitance Cd of diode element Di and gate capacitance Cg of MOS transistor PQ. Gate potential Vg2 is at a level between emitter potential Ve and collector potential Vc.

When the turn-off state is attained and IGBT 2 is in the off state (nonconductive state), diode element Di is in a reverse bias state. In this state, a leakage current of diode element Di and other cause gate potential Vg2 to attain finally the same level as emitter potential Ve. In an actual (practical) device structure, however, as will be described below, depending on a balance between the current flowing between gate electrode node 6 and collector electrode node 3 and the voltages applied across gate capacitance Cg and a junction capacitance Cd, respectively, gate potential Vg2 is balanced and kept stably at a voltage level (e.g., a punch-through voltage) between emitter potential Ve and collector potential Vc.

Therefore, gate potential Vg2 of gate electrode node 6 of MOS transistor PQ can be set to a voltage level higher than emitter potential Ve, and the voltage applied across the gate insulating film of MOS transistor PQ can be reduced, so that the gate insulating film can be made thinner. In the nonconductive state, the voltage applied to the gate insulating film is low. Therefore, it is not necessary to maintain a long distance to a peripheral region (the electrode layer and others) for ensuring a withstanding voltage with respect to the peripheral region so that the occupation area of the element (cell) can be small.

Figure 3:
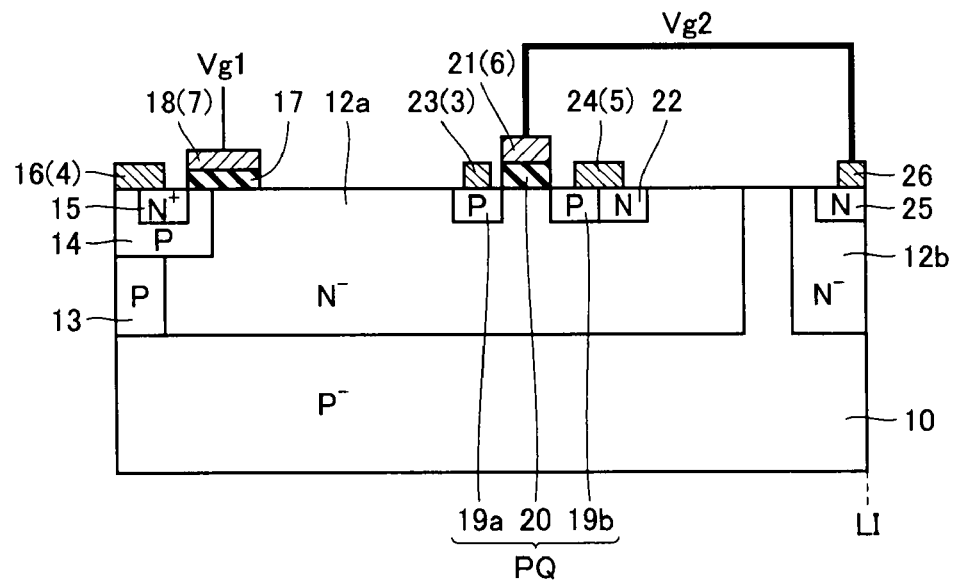
FIG. 3 schematically shows a sectional structure of the semiconductor device according to the first embodiment of the invention.

FIG. 3 schematically shows a sectional structure of the semiconductor device according to the first embodiment of the invention. Referring to FIG. 3, the semiconductor device is formed on a P-type semiconductor substrate (semiconductor substrate region) 10. N-type semiconductor regions (first and second semiconductor regions) 12a and 12b are formed, being spaced from each other, at the surface of P-type semiconductor substrate region 10.

A P-type semiconductor region (third semiconductor region) 13 is formed surrounding a part (lower region) of N-type semiconductor region 12a. In a planar layout (not shown) of this semiconductor device, the various regions are formed concentrically around an end LI on the right side of FIG. 3. Therefore, P-type semiconductor region 13 is described to be formed surrounding N-type semiconductor region 12a in the structure described below. P-type semiconductor region 13 has a function of discharging the holes to the emitter electrode node at the time of turn-off of the IGBT.

A P-type semiconductor region (fourth semiconductor region) 14 is formed on P-type semiconductor region 13 and at a part of surface of N-type and semiconductor region 12a, and a heavily doped N-type impurity region (first impurity region) 15 is provided within P-type semiconductor region 14. P-type semiconductor region 14 is formed surrounding N-type impurity region 15. An electrode layer (first electrode layer) 16 that serves as an emitter electrode connected to emitter electrode node 4 is formed in contact with both P-type semiconductor region 14 and N-type impurity region 15. By emitter electrode layer 16, the back gate and source of N-channel MOS transistor NQ shown in FIG. 1 are electrically connected together to emitter electrode node 4.

An electrode layer (second electrode layer) 18 that serves as a gate electrode connected to gate electrode node 7 is formed on the surface of P-type semiconductor region 14 with a gate insulating film (first insulating film) 17 formed in between. Gate insulating film 17 and gate electrode layer 18 are formed extending to a position above N-type semiconductor region 12a, and form a channel at the surface of P-type semiconductor region 14 between N-type impurity region 15 and N-type semiconductor region 12a in accordance with control voltage Vg1.

P-type impurity regions (second and third impurity regions) 19a and 19b, spaced from P-type semiconductor region 14 and from each other, are formed at the surface of N-type semiconductor region 12a. An electrode layer (fourth electrode layer) 21 serving as gate electrode node 6 is formed on N-type semiconductor region 12a between P-type impurity regions 19a and 19b with a gate insulating film (second insulating film) 20 formed thereunder. An N-type impurity region (fourth impurity region) 22 is formed adjacent to P-type impurity region 19b. An electrode layer (third electrode layer) 23, serving as a collector electrode connected to collector electrode node 3 shown in FIG. 1, is formed at the surface of P-type impurity region 19a. An electrode layer (fourth electrode layer) 24, serving as base electrode node 5 shown in FIG. 1, is formed on the surfaces of both impurity regions 19b and 22.

An N-type impurity region (fifth impurity region) 25 is formed within and at the surface of N-type semiconductor region 12b. An electrode layer (fifth electrode layer) 26, electrically connected to gate electrode layer 21, is formed on the surface of N-type impurity region 25. Electrode layer 26 corresponds to a cathode electrode of diode element Di shown in FIG. 1. When diode element Di is in the nonconductive state, punch-through occurs in P-type semiconductor region 10 between N-type semiconductor regions 12a and 12b (i.e., punch-through breakdown occurs in the PN junction), and a punch-through voltage restricts the voltage applied to gate electrode layer 21.

Specifically, when the voltage between N-type impurity region 22 and P-type semiconductor substrate region 10 reaches the punch-through voltage, a depletion layer from N-type impurity region 22 reaches to semiconductor substrate region 10, and a punch-through breakdown occurs in the PN junction at the surface of P-type semiconductor substrate region 10. Also, when the depletion layer extends from the N-type impurity region 25 to reach semiconductor substrate region 10, the punch-through breakdown occurs in the PN junction between N-type semiconductor region 12b and semiconductor substrate region 10. Through the punch-through breakdown, an electric connection is made at the surface of P-type semiconductor substrate region 10 between N-type semiconductor regions 12a and 12b via the depletion layer, and the voltage produced from N-type impurity region 22 is transmitted to gate electrode layer 21 via N-type impurity region 25 and electrode layer 26, so that the lowering of gate potential Vg2 is suppressed. When gate potential Vg2 rises, the channel resistance of the P-channel MOS transistor increases to lower the voltage level of N-type impurity region 22, so that the punch-through breakdown disappears in the PN junction at the surface of semiconductor substrate region 10, to stop the rise of gate potential Vg2. Thus, the voltage level of gate electrode layer 21 is kept at a voltage level, determined by the punch-through voltage, higher than emitter potential Ve of emitter electrode layer 16.

In the structure shown in FIG. 3, N-channel MOS transistor NQ is basically formed of P-type semiconductor region 14, N-type impurity region 15, gate insulating film 17, electrode layer 18 and N-type semiconductor region (drift layer) 12a. N-channel MOS transistor NQ has the back gate formed of P-type semiconductor region 14, and the back gate and the source (impurity region 15) thereof are electrically connected with each other by electrode layer 16.

P-channel MOS transistor PQ is basically formed of P-type impurity regions 19a and 19b, N-type semiconductor region 12a, gate insulating film 20, and electrode layer 21. N-type semiconductor region 12a serving as the back gate of P-channel MOS transistor PQ is coupled to electrode layer 24 via N-type impurity region 22. This arrangement implements a structure in which the back gate and the drain of P-channel MOS transistor PQ are connected together to electrode layer 24 electrically connected to base electrode node 5.

Diode element Di is basically formed of N-type impurity region 25, N-type semiconductor region 12b, P-type semiconductor substrate region 10 and P-type semiconductor regions 13 and 14. The capacitance of the PN junction between N-type semiconductor region 12b and P-type semiconductor substrate region 10 is used for lowering the potential Vg2 of gate electrode node 6 through the capacitance division upon turn-off of the IGBT.

PNP bipolar transistor BT is basically formed of P-type impurity region 19a, N-type semiconductor region 12a and P-type semiconductor regions 13 and 14. N-type semiconductor region 12a functions as the base region of the bipolar transistor.

In the structure shown in FIG. 3, upon the turn-on of the IGBT, control voltage Vg1 applied to electrode layer 18 is set to a positive voltage level, and a channel is formed at the surface of P-type semiconductor region 14 between N-type impurity region 15 and N-type semiconductor region 12a, so that electrons flow from emitter electrode layer 16 to N-type semiconductor region 12a. At this time, the holes flow from collector electrode layer 23 through P-type impurity region 19a into N-type semiconductor region 12a. Accordingly, conductivity modulation occurs in N-type semiconductor region 12a, which in turn has the resistance value thereof lowered to cause a larger current flow in N-type semiconductor region 12a. Responsively, the base current of bipolar transistor BT increases, and the bipolar transistor (BT) is turned on. Even when the potential of collector electrode layer 23 lowers upon the turn-on, the potential difference between P-type impurity region 19a and gate electrode layer 21 is equal to or lower than threshold voltage Vthp of the P-channel MOS transistor, and the P-channel MOS transistor is kept off (nonconductive). Therefore, no adverse effect is exerted on the supply of holes from collector electrode layer 23 to N-type semiconductor region 12a.

At the time of this turn-on, impurity regions 19a, 19b and 22 are at the potential level substantially equal to that of N-type semiconductor region 12a, and thus substantially equal to emitter potential Ve. Semiconductor substrate region 10 is at the level of emitter potential Ve. The PN junction between N-type semiconductor region 12b and semiconductor substrate region 10 is in the reverse bias state, and diode element Di is kept off.

At the time of the turn-off of IGBT, control voltage Vg1 to gate electrode layer 18 is set, e.g., to 0 V, and the channel (inversion layer) at the surface of P-type semiconductor region 14 disappears. Accordingly, the current flowing path to N-type semiconductor region 12a is shut off, and bipolar transistor BT transits into the turned-off state. When the voltage Vc on collector electrode layer 23 rises, the potential difference between P-type impurity region 19a and gate electrode layer 21 exceeds threshold voltage Vthp of the P-channel MOS transistor, and the P-channel MOS transistor is turned on. A channel is formed at the surface of N-type semiconductor region 12a between P-type impurity regions 19a and 19b, so that P-type impurity region 19b absorbs the holes supplied from collector electrode layer 23 and the carriers (holes) remaining in N-type semiconductor region 12a, and the supply of the holes to N-type semiconductor region 12a is cut off.

When the discharge of the residual carriers (holes) remaining in semiconductor region 12a via emitter electrode layer 16 is completed, the bipolar transistor is turned off, and the IGBT is turned off. In the off state, the PN junction between N-type semiconductor region 12a and P-type semiconductor substrate region 10 is set in a reverse bias state, and the depletion layer expands from P-type semiconductor substrate region 10 into N-type semiconductor region 12a, and finally reaches the surface of N-type semiconductor region 12a. Accordingly, the electric field concentration at the surface of N-type semiconductor region 12a is mitigated, to implement the high-breakdown (withstanding)-voltage structure.

Upon turn-off of the IGBT, the level of gate voltage Vg2 at gate electrode layer 21 is raised according to the rising of collector potential Vc through the capacitive coupling via the gate capacitance. In this operation, the capacitive coupling by the capacitance of the PN junction between N-type semiconductor region 12b and semiconductor substrate region 10 restricts the rising of gate potential Vg2. When the voltage difference (Vc−Vg2) becomes equal to or lower than threshold voltage Vthp, a channel is formed under gate electrode layer 21, and P-type impurity regions 19a and 19b and N-type semiconductor region 12a attain the same potential via this channel, so that the supply of the holes to N-type semiconductor region 12a from collector electrode layer 23 is cut off.

Through P-type impurity region 19b, base electrode layer 24 and N-type impurity region 22, collector potential Vc is transmitted. Accordingly, the PN junction between N-type semiconductor region 12a and semiconductor substrate region 10 enters a reverse bias state, and the punch-through breakdown occurs in the PN junctions between N-type semiconductor regions 12a and 12b so that the punch-through state is established between N-type semiconductor regions 12a and 12b. This punch-through voltage suppresses the lowering of the voltage level of control voltage Vg2, to maintain gate potential Vg2 at this voltage level.

Gate potential Vg2 on gate electrode layer 21 is at a level between the emitter potential (Ve) and the collector potential (Vc). Therefore, the voltage applied across gate insulating film 20, i.e., the difference between the voltage on collector electrode layer 23 and control voltage Vg2 on gate electrode layer 21 is smaller than the collector-emitter voltage. Therefore, the film thickness of gate insulating film 20 can be small. Since it is possible to mitigate the voltage applied across gate insulating film 20, it is not necessary to employ a structure for securing the withstanding voltage, such as ensuring of a long distance between collector and gate electrode layers 23 and 21, or a large distance between the gate and base electrode layers 21 and 24 as well as a large distance between the gate and collector electrode layers 21 and 23. Thus, the whole layout area of the semiconductor device can be small.

When the punch-through occurs between N-type semiconductor regions 12a and 12b according to the collector voltage applied from collector electrode layer 23, the punch-through voltage suppresses the lowering of the voltage level of control voltage Vg2. Therefore, the distance between N-type semiconductor regions 12a and 12b is set to an extent causing the punch-through.

According to the first embodiment of the invention, as described above, the diode element is connected as the voltage mitigating element between the gate and emitter electrode nodes of the P-channel MOS transistor employed for reducing the turn-off loss. This structure can mitigate the voltage applied across the gate insulating film of the P-channel MOS transistor in turn off thereof, without adversely affecting the on and off operations of the P-channel MOS transistor. Accordingly, the semiconductor device of a small occupation area, a high-withstanding voltage structure and a low loss can be implemented.

Second Embodiment

Figure 4:
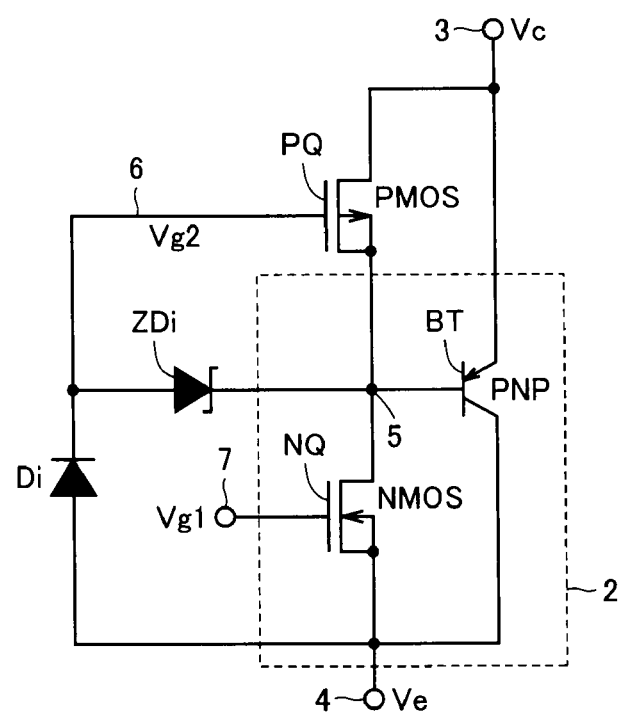
FIG. 4 shows an electrically equivalent circuit of a semiconductor device according to a second embodiment of the invention.

FIG. 4 shows an electrically equivalent circuit of a semiconductor device according to a second embodiment of the invention. The semiconductor device shown in FIG. 4 differs in following structure from the semiconductor device according to the first embodiment shown in FIG. 1. A zener diode ZDi is connected in a reverse direction between base electrode node 5 of bipolar transistor BT and gate electrode node 6 of MOS transistor PQ. Zener diode ZDi has an anode connected to the cathode of diode element Di and to the gate electrode of MOS transistor PQ, and has a cathode connected to base electrode node 5.

Zener diode ZDi is a constant-voltage diode, and is turned on when a reverse bias voltage is applied thereto, to cause a voltage (zener voltage) of a constant magnitude between its base and gate electrode nodes 5 and 6.

Other structures of the semiconductor device shown in FIG. 4 are the same as those of the semiconductor device shown in FIG. 1. The corresponding portions are allotted the same reference numerals, and description thereof will not be repeated.

Figure 5:
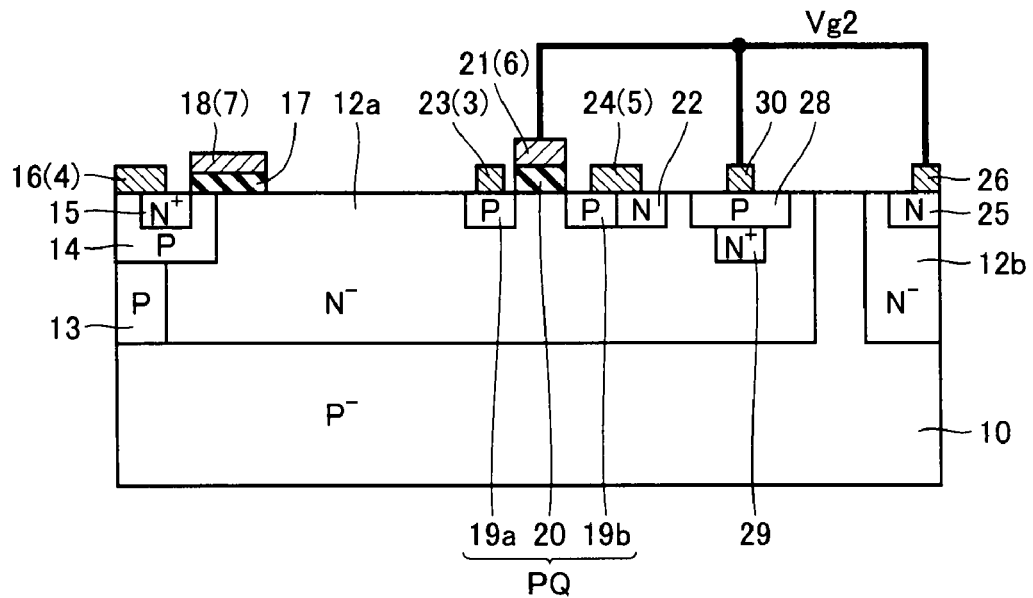
FIG. 5 schematically shows a sectional structure of the semiconductor device according to the second embodiment of the invention.

FIG. 5 schematically shows a sectional structure of the semiconductor device shown in FIG. 4. The device structure shown in FIG. 5 differs from the cross sectional structure of the semiconductor device shown in FIG. 3. In N-type semiconductor region (first semiconductor region) 12a, a P-type impurity region (seventh impurity region) 28 is formed neighboring N-type impurity region (fourth impurity region) 22, and a heavily doped N-type impurity region (sixth impurity region) 29 is formed at and in contact with a bottom of P-type impurity region 28. P-type impurity region 28 is connected to gate electrode layer 21 and cathode electrode layer 26 via an electrode layer 30. P-type impurity region 28 corresponds to an anode of zener diode ZDi, and N-type impurity region 29 corresponds to a cathode of zener diode ZDi. Owing to impurity regions 28 and 29, the zener diode can be formed in N-type semiconductor region 12a with a simple structure, and it is not necessary to arrange externally a zener diode separately.

Other structures of the semiconductor device shown in FIG. 5 are the same as those of the semiconductor device shown in FIG. 3. The corresponding portions are allotted the same reference numerals, and description thereof will not be repeated.

As described above in connection with the first embodiment of the invention, at the time of the turn-off of IGBT 2, the punch-through is caused between N-type semiconductor region 12b serving as the cathode of diode element Di and N-type semiconductor region 10 serving as the back gate of the P-channel MOS transistor, to suppress the lowering of the potential level of gate voltage Vg2. For enhancing the operation of the P-channel MOS transistor at the time of turn-off of the IGBT, i.e., for enhancing the operation of suppressing the flow of holes into the base region (semiconductor region 12a), it is preferable that gate potential Vg2 is lower. However, excessively low gate potential Vg2 may possibly cause the following problem. When collector voltage Vc of collector electrode layer 23 rises, a large potential difference occurs between P-type impurity region 19a and gate electrode layer 21, and the voltage applied across gate insulating film 20 becomes excessively high, so that the withstanding characteristics may be impaired. Further, when a relative potential difference between N-type semiconductor regions 12a and 12b is large, the PN junction breakdown voltage cannot be secured, and the withstanding voltage of the IGBT may possibly lower.

For avoiding the above problem, zener diode ZDi is arranged. Specifically, when gate potential Vg2 lowers and the collector potential Vc rises to cause a large potential difference between base and gate electrode nodes 5 and 6, zener breakdown of zener diode ZDi suppresses the lowering of gate potential Vg2.

More specifically, as shown in FIG. 5, base electrode node 5 is connected to the back gate of the P-channel MOS transistor, or the base region of the bipolar transistor through electrode layer 24 and N-type impurity region 22, and is electrically connected to collector electrode layer 23 (collector electrode node 3) via P-type impurity region 19a. Therefore, when gate potential Vg2 lowers, a reverse bias voltage is applied between impurity regions 29 and 28 to cause the zener breakdown at the PN junction between P- and N-type impurity regions 28 and 29. Via this PN junction at which the zener breakdown occurs, the current is supplied from N-type semiconductor region 12a to gate electrode layer 21 (gate electrode node 6) to raise the potential level of gate potential Vg2. Thus, the gate potential Vg2 is clamped at the voltage level that is lower than collector potential Vc by the zener voltage. Thereby, at the time of turn-off of the IGBT, it is possible to suppress the application of a high voltage across gate insulating film 20 of the P-channel MOS transistor, and to prevent excessive increase of the potential difference between N-type semiconductor regions 12a and 12b, and the lowering of the breakdown voltage of the IGBT per se is suppressed.

The voltage mitigating operation by diode element Di is substantially the same as that in the first embodiment.

According to the second embodiment of the invention, as described above, the constant-voltage diode (zener diode) is connected between the base electrode node of the bipolar transistor and the gate electrode node of the P-channel MOS transistor. Thus, the following advantageous effect can be achieved, in addition to the advantageous effect of the first embodiment. It is possible to suppress the increase in difference between the collector potential and the gate potential of the P-channel MOS transistor at the time of the turn-off of IGBT, and the withstanding voltage of the P-channel MOS transistor can be ensured. Also, it is possible to suppress deterioration of the breakdown characteristics of the IGBT itself due to the punch-through voltage.

Third Embodiment

Figure 6:
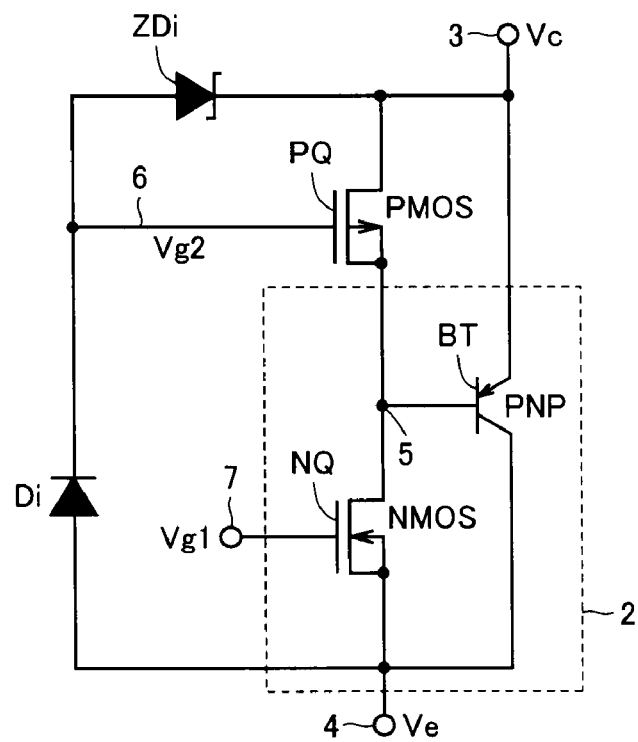
FIG. 6 shows an electrically equivalent circuit of a semiconductor device according to a third embodiment of the invention.

FIG. 6 shows an electrically equivalent circuit of a semiconductor device according to a third embodiment of the invention. The semiconductor device shown in FIG. 6 differs in following structure from the semiconductor device according to the second embodiment shown in FIG. 2. Specifically, zener diode (constant-voltage diode) ZDi is connected between collector electrode node 3 and gate electrode node 6 of the P-channel MOS transistor. Other structures of the semiconductor device shown in FIG. 6 are the same as those of the semiconductor device shown in FIG. 4. The corresponding portions are allotted the same reference numerals, and description thereof will not be repeated.

Zener diode ZDi has an anode connected to gate electrode node 6 of MOS transistor PQ and to the cathode of diode element Di, and has a cathode connected to collector electrode node 3.

In the semiconductor device shown in FIG. 6, when a large difference occurs between collector potential Vc of collector electrode node 3 and gate potential Vg2 of gate electrode node 6, zener diode ZDi turns conductive to clamp gate potential Vg2 at the voltage level that is lower than collector potential Vc by the zener breakdown voltage. Therefore, the semiconductor device shown in FIG. 6 can achieve substantially the same effect as the second embodiment through the same operation as the device according to the second embodiment.

Fourth Embodiment

Figure 7:
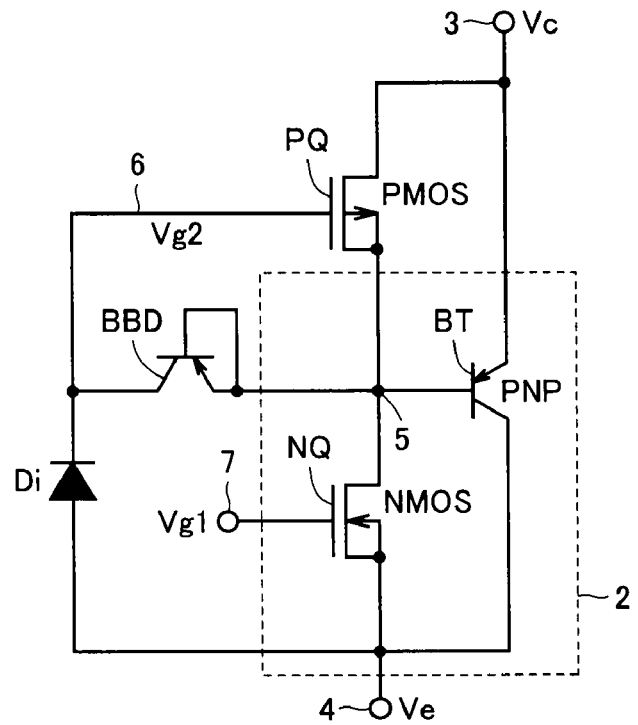
FIG. 7 shows an electrically equivalent circuit of a semiconductor device according to a fourth embodiment of the invention.

FIG. 7 shows an electrically equivalent circuit of a semiconductor device according to a fourth embodiment of the invention. The semiconductor device shown in FIG. 7 differs from the semiconductor device shown in FIG. 1 in the following structure. A PNP bipolar transistor (second bipolar transistor) BBD is connected between base electrode node 5 of bipolar transistor BT and the cathode electrode of diode element Di. The PNP bipolar transistor BBD has a base and an emitter that are connected together to base electrode node 5, and has a collector that is connected to the cathode of diode element Di and gate electrode node 6 of P-channel MOS transistor PQ. Bipolar transistor BBD has the base and the emitter connected with each other, and equivalently operates as a diode with a collector being an anode, and with a base and an emitter being a cathode. When gate potential Vg2 lowers, a reverse bias voltage causes punch-through between the collector and the emitter to suppress lowering of gate potential Vg2.

Other structures of the semiconductor device shown in FIG. 7 are the same as those of the semiconductor device shown in FIG. 1. The corresponding portions are allotted the same reference numerals, and description thereof will not be repeated.

Figure 8:
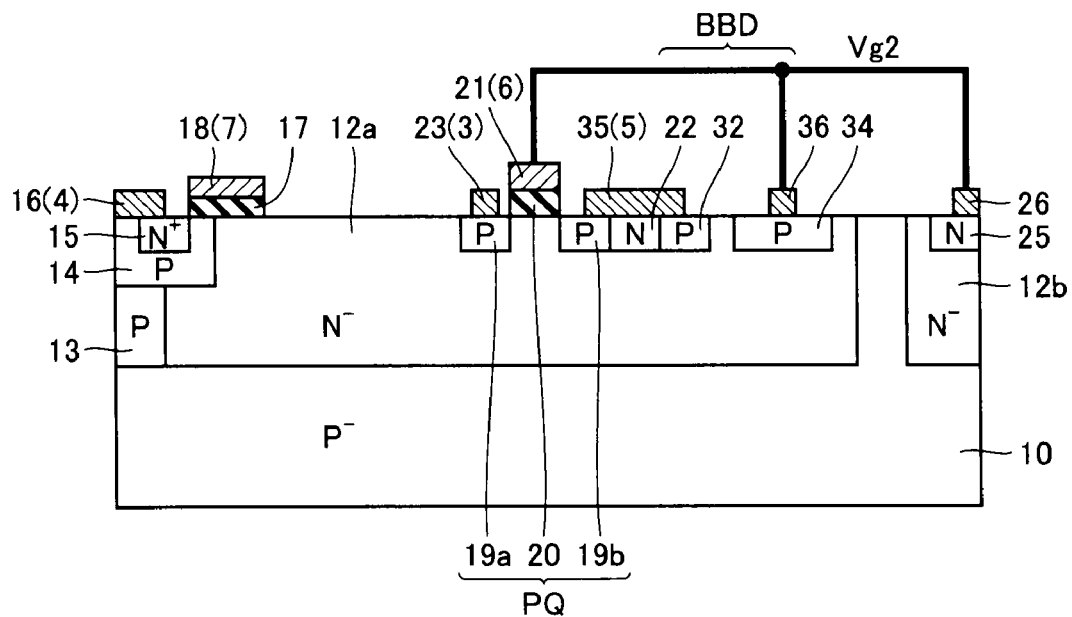
FIG. 8 schematically shows a sectional structure of the semiconductor device according to the fourth embodiment of the invention.

FIG. 8 schematically shows a sectional structure of a semiconductor device shown in FIG. 7. The semiconductor device shown in FIG. 8 differs from the semiconductor device shown in FIG. 3 in the following structure. A P-type impurity region (sixth impurity region) 32 is formed, at the surface of N-type semiconductor region (first semiconductor region) 12a, adjacent to N-type impurity region (fourth impurity region) 22 forming the base electrode of PNP bipolar transistor BT. In addition, P-type impurity region (seventh impurity region) 34 is formed, spaced from P-type impurity region 32, at the surface of N-type semiconductor region 12a. An electrode layer (fifth electrode layer) 35 forming base electrode node 5 of PNP bipolar transistor BT is electrically connected to P-type impurity region 19, N-type impurity region 22 and P-type impurity region 32. P-type impurity region 34 is electrically connected to electrode layer (fourth electrode layer) 21 forming gate electrode node 6 of the P-channel MOS transistor via an electrode layer 36.

Other sectional structures of the semiconductor device shown in FIG. 8 are the same as those of the semiconductor device shown in FIG. 3. The corresponding portions are allotted the same reference numerals, and description thereof will not be repeated.

In the semiconductor device shown in FIG. 8, PNP bipolar transistor BBD is formed of P-type impurity region 32, N-type semiconductor region 12a, N-type impurity region 22 and P-type impurity region 34. Specifically, bipolar transistor BBD has a base formed of N-type semiconductor region 12a and N-type impurity region 22, an emitter formed of P-type impurity region 32 and a collector formed of P-type impurity region 34. Electrode layer 35 interconnects the base and emitter of bipolar transistor BBD. Owing to arrangement of P-type impurity regions 32 and 34 at the surface of N-type semiconductor region 12a with a space in between, bipolar transistor BBD can be formed with a simple structure, and therefore can be easily embedded.

In the turn-off of IGBT 2, collector potential Vc rises. At this time, diode element Di lowers gate potential Vb2, and MOS transistor PQ enters the conductive state. Responsively, the potential of impurity regions 22 and 32 rise according to collector voltage Vc. In this operation, if gate potential Vg2 excessively lowers to cause a potential difference between base electrode node 5 and gate electrode node 6 equal to or higher than the punch-through voltage, a depletion layer is formed between P-type impurity regions 32 and 34, and punch-through breakdown occurs in the PN junction between P-type impurity region 34 and semiconductor region 12a. Accordingly, lowering of the voltage level of gate potential Vg2 is suppressed according to the voltage applied via PMOS transistor PQ in the conductive state.

This bipolar transistor BBD operates similarly to zener diode ZDi in the third embodiment, to clamp gate potential Vg2 of gate electrode node 6. When gate potential Vg2 of gate electrode node 6 excessively lowers, the depletion layers between P-type impurity regions 34 and 32 are connected with each other, and punch-through breakdown occurs in the PN junction between impurity region 34 and N-type semiconductor region 12a. Thereby, the base/emitter and collector are connected in bipolar transistor BBD, and the potential lowering of gate potential Vg2 is suppressed. In this operation, the punch-through phenomenon of bipolar transistor BBD, or the punch-through breakdown of the PN junction is used. The punch-through voltage can be adjusted by an impurity concentration and a distance between impurity regions 32 and 34. Further, the punch-through voltage can be set to a voltage level higher than the voltage level that causes the avalanche breakdown, as compared with the case of using the diode, and the potential level of gate potential Vg2 can be set to a voltage level lower than the voltage level in the case where the avalanche breakdown is utilized.

In FIG. 7, PNP bipolar transistor BBD is used. However, an NPN bipolar transistor may be used for obtaining the above punch-through characteristics. When such NPN bipolar transistor is used, a base and a collector thereof are connected together to gate electrode node 6, and an emitter thereof is connected to base electrode node 5. Thereby, the level lowering of gate potential Vg2 can be suppressed, utilizing the punch-through phenomenon at the PN junction.

According to the fourth embodiment of the invention, as described above, the diode-connected bipolar transistor is connected between the base electrode node of the bipolar transistor of the IGBT and the gate electrode node of the P-channel MOS transistor. Thus, the following advantageous effect can be achieved in addition to the advantageous effects of the first embodiment. Excessive lowering of the gate potential of the P-channel MOS transistor can be prevented, and the withstanding voltage of the gate insulating film of the P-channel MOS transistor can be ensured. The punch-through phenomenon at the PN junction is utilized, and the adjustment can be performed based on the impurity concentrations of the P-type impurity regions and the semiconductor region as well as the distance between the emitter and collector impurity regions, and the punch-through voltage can be adjusted more accurately than the case where the avalanche breakdown or the zener breakdown is used. In addition, the gate potential of the P-channel MOS transistor can be set to a low potential level, and the P-channel MOS transistor can be rapidly transited to the on state in the turn-off of the IGBT.

The operation and effect of diode element Di are substantially the same as those in the first embodiment.

Fifth Embodiment

Figure 9:
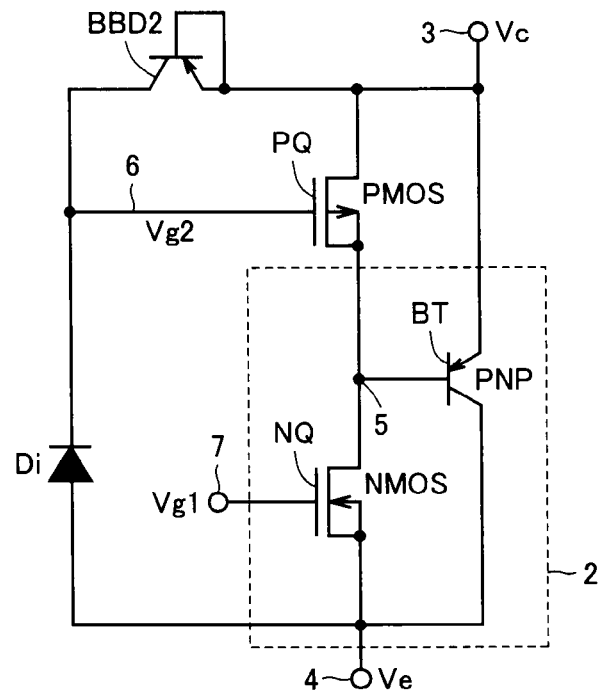
FIG. 9 shows an electrically equivalent circuit of a semiconductor device according to a fifth embodiment of the invention.

FIG. 9 is an electrically equivalent circuit of a semiconductor device according to a fifth embodiment of the invention. The semiconductor device shown in FIG. 9 differs from the semiconductor device shown in FIG. 7 in the following circuit configuration. A diode-connected PNP bipolar transistor (second bipolar transistor) BBD2 is not connected between base electrode node 5 and gate electrode node 6, but is connected between collector electrode node (first electrode node) 3 and gate electrode node 6. PNP bipolar transistor BBD2 has a base and an emitter connected together to collector electrode node 3, and has a collector connected to gate electrode node 6.

Other configuration of the semiconductor device shown in FIG. 9 is the same as that of the semiconductor device shown in FIG. 7. The corresponding portions are allotted the same reference numerals, and description thereof will not be repeated.

In the configuration of the semiconductor device shown in FIG. 9, when a large voltage difference is produced between collector potential Vc of collector electrode node 3 and gate potential Vg2 of gate electrode node 6, bipolar transistor BBD2 causes the punch-through phenomenon due to reverse bias thereof, to suppress the lowering of gate potential Vg2 by the punch-through voltage. Thereby, the lowering of gate potential Vg2 of P-channel MOS transistor PQ is suppressed, and this embodiment can provide the same effect as the fourth embodiment. Specific operations of PNP bipolar transistor BBD2 are substantially the same as those of the fourth embodiment. Specifically, the PN junction between the base and collector causes the punch-through breakdown by the reverse bias voltage, to supply the current from collector electrode node 3 to gate electrode node 6. In this state, the voltage between collector and gate electrode nodes 3 and 6 attains the level of the punch-through voltage.

The operation and effect of diode element Di are the same as those of the first embodiment.

Modification

Figure 10:
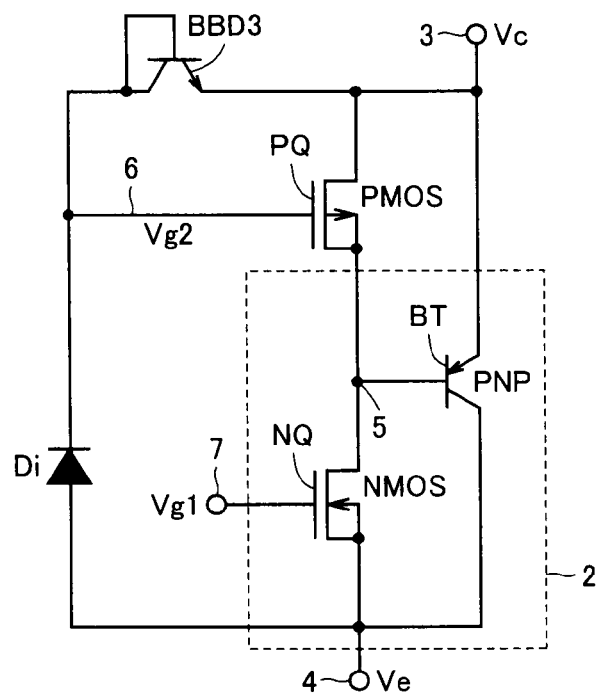
FIG. 10 shows an electrically equivalent circuit of a modification of a semiconductor device according to a fifth embodiment of the invention.

FIG. 10 shows an electrically equivalent circuit of a modification of the semiconductor device according to the fifth embodiment of the invention. The semiconductor device shown in FIG. 10 differs from the semiconductor device shown in FIG. 9 in the following circuit configuration. PNP bipolar transistor BBD2 is replaced with an NPN bipolar transistor (second bipolar transistor) BBD3. A base and a collector of NPN bipolar transistor BBD3 are connected to gate electrode node 6, and an emitter thereof is connected to collector electrode node 3.

Other configuration of the semiconductor device shown in FIG. 10 is the same as that of the semiconductor device shown in FIG. 9. The corresponding portions are allotted the same reference numerals, and description thereof will not be repeated.

The semiconductor device shown in FIG. 10 likewise utilizes the punch-through phenomenon (the punch-through phenomenon at the PN junction) by the reverse bias voltage between the base and emitter of NPN bipolar transistor BBD3, for suppressing lowering of gate potential Vg2. Therefore, the effect similar to that of the configuration of the semiconductor device shown in FIG. 9 can be achieved.

According to the fifth embodiment of the invention, as described above, the diode-connected bipolar transistor is connected between the collector electrode node and the gate electrode node of the P-channel MOS transistor, and the punch-through phenomenon is used. The punch-through phenomenon of a higher voltage can be caused, and the punch-through voltage can be more accurately set, so that the potential of the gate electrode node can be controlled more reliably. Similarly to the first embodiment, the breakdown characteristics of the gate insulating film can be maintained while maintaining the on/off characteristics of the P-channel MOS transistor. Further, this embodiment can implement substantially the same effect as the first embodiment.

Sixth Embodiment

Figure 11:
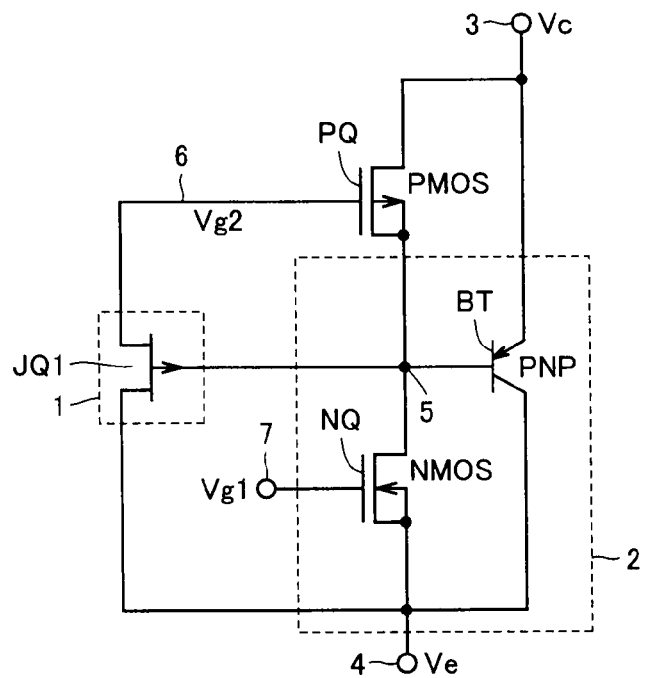
FIG. 11 shows an electrically equivalent circuit of a semiconductor device according to a sixth embodiment of the invention.

FIG. 11 is an electrically equivalent circuit of the semiconductor device according to a sixth embodiment of the invention. The semiconductor device shown in FIG. 11 uses, as voltage mitigating element 1, a P-channel Junction Field Effect Transistor (JFET) JQ1. Junction field effect transistor JQ1 has a gate connected to base electrode node 5, and drain and source regions connected to emitter electrode node 4 and gate electrode node 6, respectively. In a junction field effect transistor JFET, the source and drain regions are formed symmetrically, and in FIG. 11, the source and drain of junction field effect transistor JQ1 are provided by any of the conduction nodes thereof. In the following description, however, the node connected to gate electrode node 6 having a higher potential is referred to as the source node, and the node connected to emitter electrode node 4 is referred to as the drain node.

Other configuration of the semiconductor device shown in FIG. 11 is the same as that of the semiconductor device shown in FIG. 1. The corresponding portions are allotted the same reference numerals, and description thereof will not be repeated.

Figure 12:
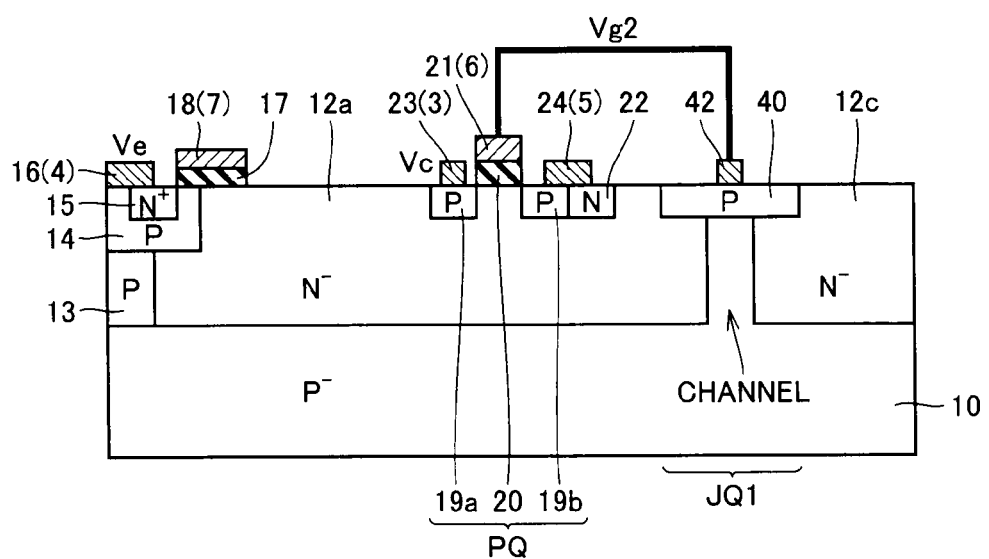
FIG. 12 schematically shows a sectional structure of the semiconductor device according to the sixth embodiment of the invention.

FIG. 12 schematically shows a sectional structure of the semiconductor device shown in FIG. 11. The semiconductor device shown in FIG. 12 differs from the semiconductor device shown in FIG. 3 in the following structure. An N-type semiconductor region (second semiconductor region) 12c is formed, spaced from N-type semiconductor region (first semiconductor region) 12a, at the surface of semiconductor substrate region 10. A P-type impurity region (fifth impurity region) 40 is formed continuously extending from a part of the region of N-type semiconductor region 12a onto a part of N-type semiconductor region 12c. P-type impurity region 40 is electrically connected to gate electrode layer (fourth electrode layer) 21 via an electrode layer 42 formed at the surface of P-type impurity region 40.

Other structures of the semiconductor device shown in FIG. 12 are the same as those of the semiconductor device shown in FIG. 3. The corresponding portions are allotted the same reference numerals, and description thereof will not be repeated.

In the sectional structure shown in FIG. 12, N-type impurity region 22 serves as the gate electrode of P-channel junction field effect transistor JQ1, and P-type semiconductor substrate region 10 between N-type semiconductor regions 12a and 12c under P-type impurity region 40 is used as the channel region of the P-channel junction field effect transistor. P-type impurity region 40 is used as the source region. N-type semiconductor regions 12a and 12c are arranged being spaced from each other, and P-type impurity region 40 is arranged at the surface of semiconductor substrate region 10 between N-type semiconductor regions 12a and 12b.

Thereby, the embedded junction field effect transistor can be implemented with a simple structure.

At the time of turn-off of the IGBT, collector potential Vc of collector electrode layer 23 rises. According to the rising of collector potential Vc, the potential of gate potential Vg2 would rise through the gate capacitance. Gate electrode layer 21 is coupled to P-type semiconductor substrate region 10 via source P-type impurity region 40, and the potential level of gate electrode layer 21 is suppressed. Accordingly, P-channel MOS transistor PQ turns conductive to set P-type impurity region 19a and N-type semiconductor region 12a to the same voltage level, and the supply of holes from collector electrode node 23 to N-type semiconductor region 12a is cut off. Thus, PNP bipolar transistor BT is rapidly turned off.

According to the rising of collector potential Vc, the potential of N-type semiconductor region 12a rises, to reverse bias the PN junction between semiconductor region 12a and semiconductor substrate region 10, so that the depletion layer expands in semiconductor substrate region 10 between N-type semiconductor regions 12a and 12c. In this state, until semiconductor substrate region 10 between semiconductor regions 12a and 12c is fully depleted, P-type impurity region 40 is connected to emitter electrode node 4 via P-type semiconductor regions 10 and 14, and gate potential Vg2 is held at the level of emitter potential Ve. During such period, PMOS transistor PQ is held in the on state to interrupt the supply of the holes supplied from collector electrode node 3, into the emitter of the bipolar transistor and further to the base thereof.

With the rising of collector potential Vc, the depletion layer expands in semiconductor substrate region 10. When P-type semiconductor substrate region 10 under P-type impurity region 40 is fully depleted, P-type impurity region 40 is isolated from P-type semiconductor substrate region 10. In this state, therefore, potential Vg2 of gate electrode layer 21 starts to rise with the rising of collector potential Vc. Gate potential Vg2 rises to the voltage level determined by the gate capacitance of MOS transistor PQ and the depletion layer capacitance of junction field effect transistor JQ1.

The punch-through voltage of the junction field effect transistor is adjusted such that the depleting of the channel of junction field effect transistor JQ1 occurs after the turn-on of P-channel MOS transistor PQ. The punch-through voltage, or the expansion of the depletion layer can be adjusted by adjusting the distance between semiconductor regions 12a and 12c, the impurity concentrations of them and the impurity concentration of P-type semiconductor substrate region 10.

Thus, substantially simultaneous with turn off of IGBT 2, P-channel MOS transistor PQ is also turned on, and gate potential Vg2 rises after the turn-off to prevent the application of a high voltage (collector-emitter voltage Vce) across gate insulating film 20 of P-channel MOS transistor PQ.

Modification

Figure 13:
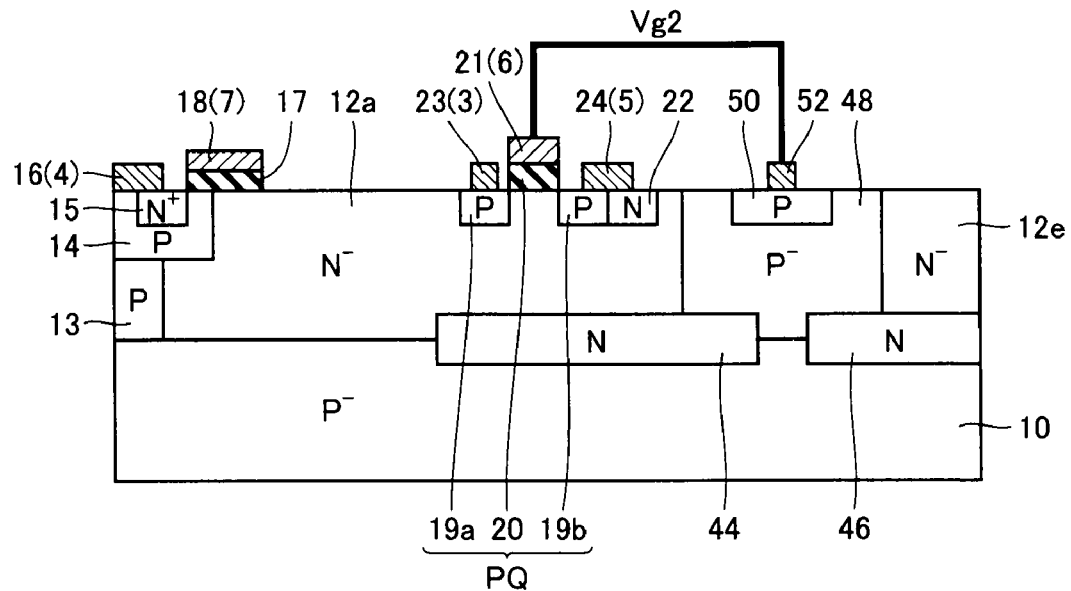
FIG. 13 schematically shows a sectional structure of a modification of the semiconductor device according to the sixth embodiment of the invention.

FIG. 13 schematically shows a sectional structure of a modification of a semiconductor device according to the sixth embodiment of the invention. The semiconductor device shown in FIG. 13 differs from the semiconductor device shown in FIG. 12 in the following structure. N-type semiconductor regions (first and second semiconductor regions) 12a and 12e are formed, spaced from each other, at the surface of P-type semiconductor substrate region 10. A lightly doped P-type semiconductor region (fifth semiconductor region) 48 is formed between N-type semiconductor regions 12a and 12e. A P-type impurity region (fifth impurity region) 50 is formed, being surrounded by P-type semiconductor region 48, at the surface of P-type semiconductor region 48. P-type impurity region 50 is electrically connected to gate electrode layer (fourth electrode layer) 21 via an electrode layer 52.

N-type buried impurity regions (first and second buried semiconductor regions) 44 and 46 are formed, spaced from each other, between N-type semiconductor region 12a and P-type semiconductor substrate region 10 and between N-type semiconductor region 12e and P-type semiconductor substrate region 10, respectively. N-type buried impurity regions 44 and 46 have much higher impurity concentrations than N-type semiconductor regions 12a and 12e and P-type semiconductor region 48. The distance between these N-type buried impurity regions 44 and 46 is shorter than that between semiconductor regions 12a and 12e.

P-type semiconductor region 48 is continuously coupled with P-type semiconductor substrate region 10 via a region between N-type embedded impurity regions 44 and 46. P-type semiconductor region 48 and semiconductor substrate region 10 between N-type semiconductor regions 44 and 46 are used as a channel region of junction field effect transistor JQ1. P-type impurity region 48 is used as a source region. N-type impurity region 22, N-type semiconductor regions 12a and 12e, and N-type buried impurity regions 44 and 46 are used as the gates. In the structure shown in FIG. 13, the junction field effect transistor can be embedded with a simple structure.

Other structures of the semiconductor device shown in FIG. 13 are the same as those of the semiconductor device shown in FIG. 12. The corresponding portions are allotted the same reference numerals, and description thereof will not be repeated.

In the semiconductor device shown in FIG. 13, upon turn off of the IGBT, the depletion layer expands in P-type semiconductor substrate region 48 from N-type semiconductor region 12a and N-type buried impurity region 44 with the potential rising of collector potential Vc. In this case, the PN junction is in a reverse bias state, and the depletion layer rapidly from heavily doped N-type buried impurity region 44 into a region of a lower impurity concentration, or into P-type semiconductor region 48 and semiconductor substrate region 10. Before the punch-through state of the depletion layer is attained, gate electrode layer 21 is coupled to emitter electrode layer 18 via electrode layer 52, P-type impurity region 50, semiconductor region 48 and semiconductor substrate region 10, and the rising of gate potential Vg2 is suppressed.

As collector potential Vc rises, the depletion layer expands in P-type semiconductor region 48 between N-type buried impurity regions 44 and 46. When the depletion layer punches through between heavily doped N-type buried impurity regions 44 and 46, junction field effect transistor JQ enters a pinch-off state, and gate electrode layer 21 is isolated from emitter electrode layer 18. In this punch-through state of the depletion layer, the depletion layer is formed at a periphery of heavily doped N-type buried impurity regions 44 and 46, and the depletion layer does not reach P-type impurity region 50, so that P-type impurity region 50 is set into a state of being surrounded by the depletion layer. The voltage is applied across the depletion layer. In the pinch-off state, therefore, electric field between the depletion layer end (pinch-off point) and P-type impurity region 50 does not change, and the voltage at P-type impurity region 50 can be kept substantially constant. Thus, gate potential Vg2 can be held substantially at a constant level after P-channel junction field-effect transistor JQ1 turns into the pinch-off state, and the voltage applied across gate insulating film 20 can be kept substantially constant. Thus, the withstanding voltage of gate insulating film 20 can be ensured with the simple structure reliably.

As described above, in the sixth embodiment of the invention, the P-channel junction field effect transistor is used as the voltage mitigating element, and such a phenomenon of causing the pinch-off through the expansion of the depletion layer in the channel region of field effect transistor is used. Accordingly, upon turn off of the IGBT, the P-channel MOS transistor can be rapidly and temporarily set to the on state reliably, and then to the off state. Further, the voltage applied across the gate insulating film can be mitigated, and the occupation area of the semiconductor device (cell) can be reduced while maintaining the withstanding voltage, as in the first embodiment.

Seventh Embodiment

Figure 14:
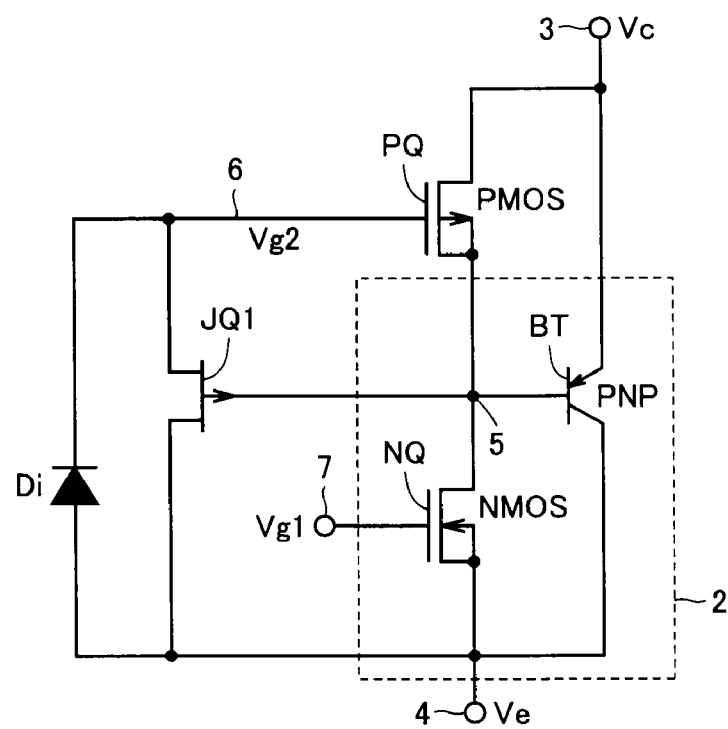
FIG. 14 shows an electrically equivalent circuit of a semiconductor device according to a seventh embodiment of the invention.

FIG. 14 shows an electrically equivalent circuit of the semiconductor device according to a seventh embodiment of the invention. The semiconductor device shown in FIG. 14 differs from the semiconductor device according to the sixth embodiment shown in FIG. 11 in the following configuration. Diode element Di is further connected between gate electrode node 6 and emitter electrode node 4 of P-channel MOS transistor PQ. Diode element Di has a cathode connected to gate electrode node 6, and an anode connected to emitter electrode node 4. Other configuration of the semiconductor device shown in FIG. 14 is the same as that of the semiconductor device shown in FIG. 11. The corresponding portions are allotted the same reference numerals and description thereof will not be repeated.

Figure 15:
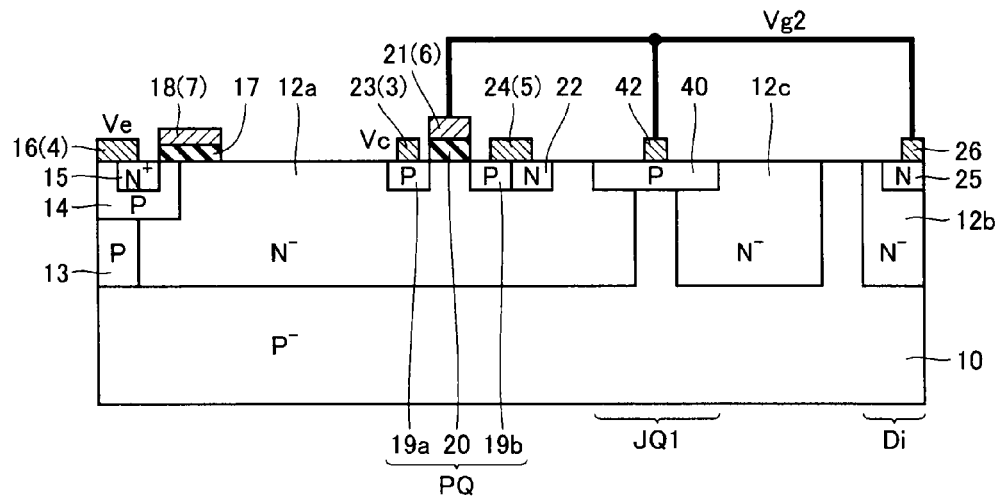
FIG. 15 schematically shows a sectional structure of the semiconductor device according to the seventh embodiment of the invention.

FIG. 15 schematically shows a sectional structure of the semiconductor device shown in FIG. 14. The semiconductor device shown in FIG. 15 differs from the semiconductor device according to the sixth embodiment shown in FIG. 12 in the following structure. N-type semiconductor region (second semiconductor region) 12b is formed at the surface of semiconductor substrate region 10, being spaced from N-type semiconductor region (fifth semiconductor region) 12c forming junction field effect transistor JQ1. N-type impurity region (fifth impurity region) 25 is formed, being surrounded by N-type semiconductor region 12b, at the surface of N-type semiconductor region 12b. N-type impurity region 25 is electrically connected to gate electrode layer (fourth electrode layer) 21 via electrode layer 26. N-type semiconductor regions 12a, 12b and 12c are spaced from each other, and the semiconductor substrate region is formed extending in between, so that the structure embedding both the diode and the bipolar transistor can be implemented with a simple structure.

As shown in these FIGS. 14 and 15, the structure of the semiconductor device according to the seventh embodiment of the invention is essentially equivalent to the combination of the semiconductor devices of the first and sixth embodiments shown in FIGS. 1 and 11, respectively. Upon turn on of IGBT 2, collector potential Vc of collector electrode node 3 rapidly lowers. In this state, the charges accumulated in the gate capacitance of P-channel MOS transistor PQ are discharged to emitter electrode layer 16 (emitter electrode node 4) via impurity region 40 of junction field effect transistor JQ1, and MOS transistor PQ has the gate potential Vg2 transited to substantially the same level as emitter potential Ve so and responsively is turned off.

When the resistance of the discharging path (P-type semiconductor substrate region 10 and P-type semiconductor regions 13 and 14) of P-channel junction field effect transistor JQ1 is excessively large, discharging of the electric charges accumulated in the gate capacitance is slowed down, and there may possibly be present a time period in which gate potential Vg2 is lower than emitter potential Ve as gate potential lowers with lowering of collector potential Vc. In this case, the potential difference between the source and gate of P-channel MOS transistor PQ becomes larger than the threshold voltage of P-channel MOS transistor PQ, and P-channel MOS transistor PQ holds the on state. Consequently, the emitter and the base of PNP bipolar transistor BT are short-circuited, and injection of holes from collector electrode layer 23 (collector electrode node 3) into the emitter of PNP bipolar transistor BT is prevented so that turn-on of PNP bipolar transistor BT is delayed (i.e., the conductivity modulation at N-type semiconductor substrate 12a is suppressed).

In this state, at the time when gate potential Vg2 reaches emitter potential Ve, diode element Di enters a forward bias state, and discharges the charges accumulated in the gate capacitance of P-channel MOS transistor PQ with a low resistance. Thereby, it is possible to prevent the state in which MOS transistor PQ holds the on state at the time of turn-on of IGBT 2, and accordingly IGBT 2 can be turned on rapidly.

The turn-off operation is the same as that in the sixth embodiment.

For junction field effect transistor JQ1, a structure as shown in FIG. 13 may be employed.

According to the seventh embodiment of the invention, as described above, the diode element and the junction field effect transistor are arranged in parallel between the gate the P-channel MOS transistor and emitter electrode nodes, and the IGBT can be rapidly turned on. Further, in the seventh embodiment, the same effects as the first to sixth embodiments can be achieved.

Eighth Embodiment

Figure 16:
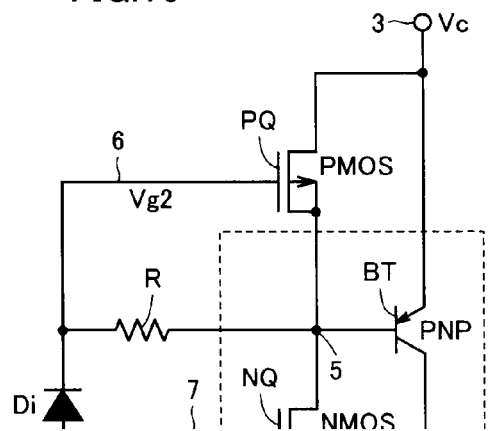
FIG. 16 shows an electrically equivalent circuit of a semiconductor device according to an eighth embodiment of the invention.

FIG. 16 shows an electrically equivalent circuit of the semiconductor device according to the eighth embodiment of the invention. In the configuration of the semiconductor device shown in FIG. 16, a resistance element R is employed in place of the zener diode (ZDi) in the semiconductor device according to the second embodiment shown in FIG. 4. Other configuration of the semiconductor device shown in FIG. 16 is the same as that of the semiconductor device shown in FIG. 4. The corresponding portions are allotted the same reference numerals, and description thereof will not be repeated.

Resistance element R is connected between base and gate electrode nodes 5 and 6, and suppresses the potential lowering of gate electrode node 6 upon turn off of IGBT 2.

Figure 17:
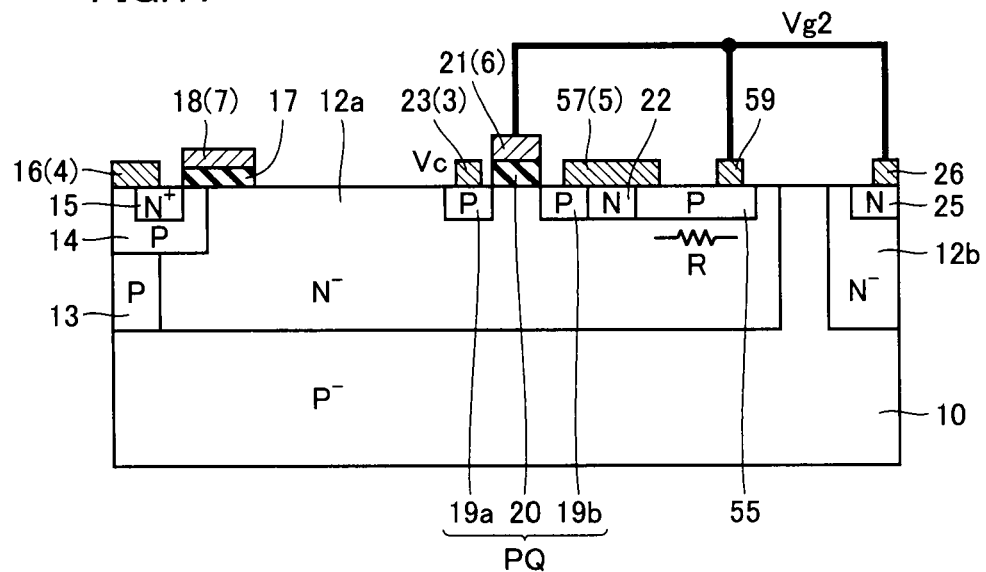
FIG. 17 schematically shows a sectional structure of the semiconductor device according to the eighth embodiment of the invention.

FIG. 17 schematically shows a sectional structure of the semiconductor device shown in FIG. 16. In the structure of the semiconductor device shown in FIG. 17, a P-type impurity region (sixth impurity region) 55 is formed, adjacent to N-type impurity region (fourth impurity region) 22, at the surface of N-type semiconductor region (first semiconductor region) 12a. An electrode layer (fifth electrode layer) 57 is formed commonly to P-type impurity regions 19b and 55 as well as N-type impurity region (fourth impurity region) 22. Electrode layer 57 corresponds to the base electrode layer connected to base electrode node 5. An electrode layer 59 is formed, opposing to electrode layer 57, on the other end of P-type impurity region 55. Electrode layer 59 is electrically connected to gate electrode layer (fourth electrode layer) 21 and electrode layer 26. Other sectional structures of the semiconductor device shown in FIG. 17 are the same as those of the semiconductor device shown in FIG. 5. The corresponding portions are allotted the same reference numbers, and description thereof will not be repeated.

In the structure of the semiconductor device shown in FIG. 17, the diffusion resistance of P-type impurity region 55 provides resistance element R, instead of the zener diode that is formed by P- and N-type impurity regions (seventh and sixth impurity regions) 28 and 29 shown in FIG. 5. Since the diffusion resistance of impurity region 55 at the surface of N-type semiconductor region 12a is used, the structure embedding diode element Di and resistance element R can be implemented with a simple structure.

In the structure shown in FIGS. 16 and 17, diode element Di lowers potential Vg2 of gate electrode node 6 (gate electrode layer 21) towards the emitter potential direction, and therefore, it tends to hold P-channel MOS transistor PQ in the on state when IGBT 2 is in the off state. At the time of turn-off, collector potential Vc is high, so that resistance element R formed by P-type impurity region 55 will hold gate electrode layer 21 (gate electrode node 6) at the potential level equal to collector potential Vc after a delay time of the resistance element elapses. Accordingly, the potential difference between the source and gate will become smaller than the threshold voltage of MOS transistor PQ, and P-channel MOS transistor PQ is held in the off state. Therefore, at the time of turn-on of IGBT 2, P-channel MOS transistor PQ is kept off, and the IGBT operation can be performed at a faster timing to reduce the turn-on loss. When P-channel MOS transistor PQ is in the off state, the voltage between its gate and source, i.e., the voltage applied across the gate insulating film is small, so that the withstanding voltage of the gate insulating film is ensured reliably.

At the time of turn-off of IGBT 2, resistance element R responds to the change in gate potential Vg2 with a certain delay due to its inherent delay time. Therefore, when collector potential Vc rises, gate potential Vg2 of gate electrode layer 21 (gate electrode node 6) is lowered due to the punch-through of diode element Di, and P-channel MOS transistor PQ is turned on to stop the flow of the holes into bipolar transistor BT at the time of turn-off. Upon completion of this transition state at the time of turn-off, resistance element R sets gate potential Vg2 to the level substantially equal to collector potential Vc. In addition, diode element Di suppresses the excessive lowering of gate potential Vg2 at the time of the turn-off.

By using resistance element R (P-type impurity region 55), the potential lowering of gate potential Vg2 during the off state of the IGBT is suppressed, and the potential difference between N-type semiconductor regions 12a and 12b can be reduced, so that the problem of lowering of the withstanding voltage between N-type semiconductor regions 12a and 12b can be avoided.

According to the eighth embodiment of the invention, the resistance element is connected between the gate electrode node of the P-channel MOS transistor and the base node of the bipolar transistor, and the diode element is used to suppress the lowering of the gate potential of the P-channel MOS transistor. Thus, in addition to the effect of the first embodiment, such advantageous effect can be achieved that the semiconductor device that can further reduce the switching loss, can perform the fast switching operation and has the reliable withstanding characteristics.

Ninth Embodiment

Figure 18:
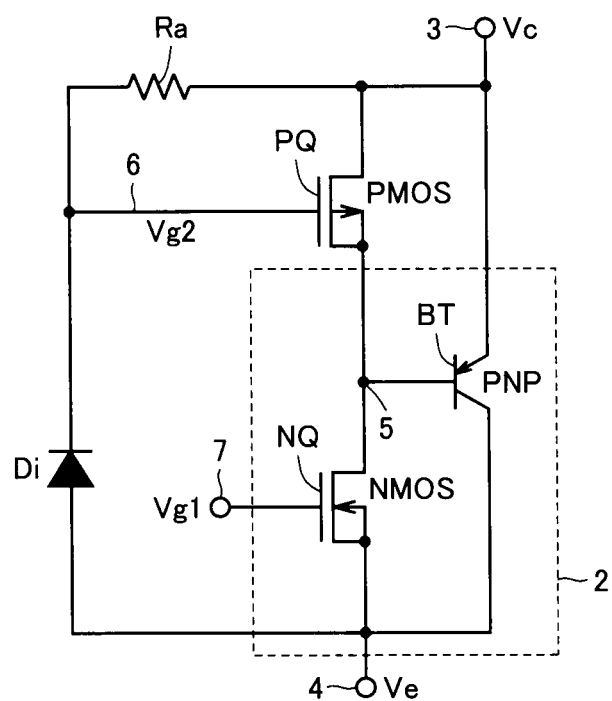
FIG. 18 shows an electrically equivalent circuit of a semiconductor device according to a ninth embodiment of the invention.

FIG. 18 shows an electrically equivalent circuit of a semiconductor device according to a ninth embodiment of the invention. The semiconductor device shown in FIG. 18 differs from that semiconductor device according to the eighth embodiment in the following configuration. A resistance element Ra is not connected between base and gate electrode nodes 5 and 6, but is connected between gate and collector electrode nodes 6 and 3. Other configuration of the semiconductor device shown in FIG. 18 is the same as that of the semiconductor device shown in FIG. 16. The corresponding portions are allotted the same reference numerals, and description thereof will not be repeated.

In the semiconductor device shown in FIG. 18, resistance element Ra is connected between gate and collector electrode nodes 6 and 3. The gate capacitance of MOS transistor PQ and resistance element Ra are connected in parallel. The change in gate potential Vg2 by resistance element Ra is caused with a delay relative to the potential change by the gate capacitance of the MOS transistor. Therefore, through the operation similar to that of the eighth embodiment, P-channel MOS transistor PQ is temporarily made conductive at the time of transition of IGBT 2 to the off state, and then P-channel MOS transistor PQ is held in the off state during the off state of IGBT 2. Therefore, this embodiment can provide the same effect as the eighth embodiment through essentially the same operations.

In general, when the invention can be applied to the semiconductor device performing the power switching, such a semiconductor device with a low on-voltage and a small occupation area can be implemented that performs the fast switching operation with excellent withstanding characteristics. The semiconductor device may be a discrete transistor single, and may also be embedded in an integrated circuit device such as a module.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a first bipolar transistor having a first conduction node connected to a first electrode node, a second conduction node connected to a second electrode node and a first base node;
    a first insulated gate field effect transistor of a first conductivity type connected between the second electrode node and the base node of the first bipolar transistor, and selectively placed in a conductive state according to a control signal and connecting electrically the second electrode node to the base node of the first bipolar transistor when made conductive;
    a second insulated gate field effect transistor of a second conductivity type having a gate electrode, a third conduction node electrically connected to the first electrode node and a fourth conduction node electrically connected to the base node of the first bipolar transistor, and the second insulated gate field effect transistor selectively placed in a conductive state according to a voltage on the gate electrode and a voltage on the first electrode node and connecting electrically the first electrode node to the base node of the first bipolar transistor when made conductive; and
    a voltage mitigating element connected between the second electrode node and the gate electrode of the second insulated gate field effect transistor, for mitigating a voltage applied across a gate insulating film of the second insulated gate field effect transistor when the first bipolar transistor is off, wherein
    a voltage at the first conduction node is greater than a voltage at the second conduction node.

2. The semiconductor device according to claim 1, wherein the voltage mitigating element is a diode element having a PN junction.

3. The semiconductor device according to claim 2, further comprising:
    a constant-voltage diode connected between the gate electrode of the second insulated gate field effect transistor and the base node of the first bipolar transistor, for causing a constant voltage between the gate electrode and the base node when made conductive.

4. The semiconductor device according to claim 2, further comprising:
    a constant voltage diode connected between the first electrode node and the gate electrode of the second insulated gate field effect transistor, for producing a constant voltage between the first electrode node and the gate electrode when made conductive.

5. The semiconductor device according to claim 2, further comprising:
    a diode-connected second bipolar transistor connected between the gate electrode of the second insulated gate field effect transistor and the base node of the first bipolar transistor, for reducing a potential difference between the gate electrode and the base node when made conductive.

6. The semiconductor device according to claim 2, further comprising:
    a diode-connected second bipolar transistor connected between the first electrode node and the gate electrode of the second insulated gate field effect transistor, for reducing a potential difference between the first electrode node and the gate electrode when made conductive.

7. The semiconductor device according to claim 2, further comprising:
    a junction-type field effect transistor having a fifth conduction node electrically connected to the gate electrode of the second insulated gate field effect transistor, a sixth conduction node electrically connected to the second electrode node and a control electrode electrically connected to the base node of the first bipolar transistor.

8. The semiconductor device according to claim 2, further comprising:
    a resistance element connected between the base node of the first bipolar transistor and a connection node between the gate electrode of the second insulated gate field effect transistor and the diode element.

9. The semiconductor device according to claim 2, further comprising:
    a resistance element connected between the gate electrode of the second insulated gate field effect transistor and the first electrode node.

10. The semiconductor device according to claim 1, wherein
    the voltage mitigating element is a junction-type field effect transistor having a fifth conduction node electrically connected to the gate electrode of the second insulated gate field effect transistor, a sixth conduction node electrically connected to the second electrode node and a control electrode electrically connected to the base node of the first bipolar transistor.

11. A semiconductor device comprising:
    a semiconductor substrate region of a first conductivity type;
    a first semiconductor region of a second conductivity type formed at a surface of the semiconductor substrate region;
    a second semiconductor region of the second conductivity type formed, at the surface of the semiconductor substrate region, apart from the first semiconductor region;

a third semiconductor region of the first conductivity type adjacent to the first semiconductor region;

a fourth semiconductor region of the first conductivity type formed on the third semiconductor region and on a surface of a partial region within the first semiconductor region;

a first impurity region of the second conductivity type formed at a partial region of a surface of the fourth semiconductor region;

a first electrode layer formed being electrically connected to the fourth semiconductor region and to the first impurity region;

a second electrode layer formed on the fourth semiconductor region between the first impurity region and the first semiconductor region and on a part of the first semiconductor region with a first insulating film interposed in between;

second and third impurity regions of the first conductivity type formed at a surface of the first semiconductor region, spaced from the fourth semiconductor region and apart from each other;

a fourth impurity region of the second conductivity type formed, at the surface of the first semiconductor region, adjacent to the third impurity region;

a third electrode layer electrically connected to the second impurity region;

a fourth electrode layer formed on the surface of the first semiconductor region between the second and third impurity regions with a second insulating film interposed in between;

a fifth electrode layer formed being electrically connected to the third and fourth impurity regions; and a fifth impurity region of the second conductivity type formed at the surface of the second semiconductor region and electrically coupled to the fourth electrode layer.

12. The semiconductor device according to claim 11, further comprising:
a sixth impurity region of the second conductivity type formed, in the first semiconductor region, apart from the third and fourth impurity regions; and
a seventh impurity region of the first conductivity type formed on and in contact with the sixth impurity region, and electrically coupled to the fourth electrode layer.

13. The semiconductor device according to claim 11, further comprising:
a sixth impurity region formed, at the surface of the first semiconductor region, adjacent to the fourth impurity region and electrically connected to the fifth electrode layer; and
a seventh impurity region of the first conductivity type formed, at the surface of the first semiconductor region, spaced from the sixth impurity region and electrically coupled to the fourth electrode layer.

14. The semiconductor device according to claim 11, further comprising:
a fifth semiconductor region of the second conductivity type formed, at the surface of the semiconductor substrate region, apart from and between the first and second semiconductor regions; and
a sixth impurity region of the first conductivity type formed at a part of each of the first and fifth semiconductor regions and at the surface of the semiconductor substrate region, and electrically connected to the fourth electrode layer.

15. The semiconductor device according to claim 11, further comprising:
a sixth impurity region of the first conductivity type formed at the surface of the first semiconductor region, and having opposite ends electrically connected to the fourth and fifth electrode layers, respectively.

16. A semiconductor device comprising:
a semiconductor substrate region of a first conductivity type;
first and second semiconductor regions of a second conductivity type formed, at a surface of the semiconductor substrate region, apart from each other;
a third semiconductor region of the first conductivity type formed in contact with the first semiconductor region;
a fourth semiconductor region of the first conductivity type formed on the third semiconductor region and on a surface of a part of the first semiconductor region;
a first impurity region of the second conductivity type formed at a surface of a part of the fourth semiconductor region;
a first electrode layer formed being electrically connected to the fourth semiconductor region and the first impurity region;
a second electrode layer formed on the fourth semiconductor region between the first impurity region and the first semiconductor region and on the first semiconductor region with a first insulating film interposed in between;
second and third impurity regions of the first conductivity type formed, at the surface of the first semiconductor region, apart from the fourth semiconductor region and from each other;
a third electrode layer formed being electrically connected to the second impurity region;
a fourth electrode layer formed on the surface of the first semiconductor region between the second and third impurity regions with a second insulating film interposed in between;
a fourth impurity region of the second conductivity type formed, at the surface of the first semiconductor region, adjacent to the third impurity region;
a fifth electrode layer formed being electrically connected to the third and fourth impurity regions; and
a fifth impurity region of the first conductivity type provided apart from the third and fourth impurity regions, formed on a surface of a part of each of the first and second semiconductor regions and continuously over the semiconductor substrate region between the first and second semiconductor regions, and electrically connected to the fourth electrode layer.

17. A semiconductor device comprising:
a semiconductor substrate region of a first conductivity type;
first and second semiconductor regions of a second conductivity type formed, at a surface of the semiconductor substrate region, apart from each other;
a third semiconductor region of the first conductivity type formed in contact with the first semiconductor region;
a fourth semiconductor region of the first conductivity type formed on the third semiconductor region and on a surface of a part of the first semiconductor region;
a first impurity region of the second conductivity type formed at a surface of a part of the fourth semiconductor region;
a first electrode layer formed being electrically connected to the fourth semiconductor region and to the first impurity region;

a second electrode layer formed on the fourth semiconductor region between the first impurity region and the first semiconductor region and on the first semiconductor region with a first insulating film interposed in between;

second and third impurity regions of the first conductivity type formed, at the surface of the first semiconductor region, apart from the fourth semiconductor region and from each other;

a third electrode layer formed being electrically connected to the second impurity region;

a fourth electrode layer formed on the surface of the first semiconductor region between the second and third impurity regions with a second insulating film interposed in between;

a fourth impurity region of the second conductivity type formed, at the surface of the first semiconductor region, adjacent to the third impurity region;

a fifth electrode layer formed being electrically connected to the third and fourth impurity regions;

a fifth semiconductor region of the first conductivity type formed, between the first and second semiconductor regions, being electrically in contact with the semiconductor substrate region;

a fifth impurity region of the first conductivity type formed at the surface of the fifth semiconductor region and electrically coupled to the fourth electrode layer; and first and second buried semiconductor regions of the second conductivity type formed between the semiconductor substrate region and the first semiconductor region and between the semiconductor substrate region and the second semiconductor region, respectively, and formed apart from each other, the fifth semiconductor region being coupled to the semiconductor substrate region via a region between the first and second buried semiconductor regions.

* * * * *